(12) United States Patent
Cheng

(10) Patent No.: US 11,699,736 B2
(45) Date of Patent: Jul. 11, 2023

(54) GATE STRUCTURE AND METHOD

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 194 days.

(21) Appl. No.: 17/194,688

(22) Filed: Mar. 8, 2021

(65) Prior Publication Data

US 2021/0408259 A1 Dec. 30, 2021

Related U.S. Application Data

(60) Provisional application No. 63/044,274, filed on Jun. 25, 2020.

(51) Int. Cl.
*H01L 29/49* (2006.01)
*H01L 27/092* (2006.01)
(Continued)

(52) U.S. Cl.
CPC .... *H01L 29/4908* (2013.01); *H01L 21/02532* (2013.01); *H01L 21/02603* (2013.01);
(Continued)

(58) Field of Classification Search
CPC ........... H01L 29/4908; H01L 21/02532; H01L 21/02603; H01L 21/28088; H01L 21/32135; H01L 21/823807; H01L 21/823814; H01L 21/823842; H01L 21/823864; H01L 21/823871; H01L 27/092; H01L 29/0673; H01L 29/42392; H01L 29/66545; H01L 29/66553; H01L 29/66742; H01L 29/78696; H01L 21/82345; H01L 29/66439; H01L 21/67051; H01L 27/088; H01L 29/165; H01L 29/7848; H01L 21/32134; H01L 27/0924; H01L 21/823821; H01L 21/823828; H01L 21/823412;
(Continued)

(56) References Cited

U.S. PATENT DOCUMENTS 9,236,267 B2 1/2016 De et al.
9,502,265 B1 11/2016 Jiang et al.
(Continued)

FOREIGN PATENT DOCUMENTS

CN 107546121 B 5/2020
DE 102019126285 A1 3/2021
(Continued)

*Primary Examiner* — Tong-Ho Kim
(74) *Attorney, Agent, or Firm* — Seed IP Law Group

(57) ABSTRACT

A device includes a substrate, a semiconductor channel over the substrate, and a gate structure over and laterally surrounding the semiconductor channel. The gate structure includes a first dielectric layer over the semiconductor channel, a first work function metal layer over the first dielectric layer, a first protection layer over the first work function metal layer, a second protection layer over the first protection layer, and a metal fill layer over the second protection layer.

20 Claims, 28 Drawing Sheets

(51) Int. Cl.
*H01L 29/06* (2006.01)
*H01L 29/423* (2006.01)
*H01L 29/786* (2006.01)
*H01L 21/02* (2006.01)
*H01L 21/28* (2006.01)
*H01L 21/3213* (2006.01)
*H01L 21/8238* (2006.01)
*H01L 29/66* (2006.01)
*G05B 13/02* (2006.01)

(52) U.S. Cl.
CPC .. *H01L 21/28088* (2013.01); *H01L 21/32135* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 27/092* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78696* (2013.01); *G05B 13/0265* (2013.01)

(58) Field of Classification Search
CPC ..... H01L 21/823437; H01L 21/823462; H01L 29/4966; G05B 13/0265; G05B 2219/45031; G05B 19/418; B82Y 10/00; Y02P 90/02
USPC .......................................................... 257/351
See application file for complete search history.

(56) References Cited

U.S. PATENT DOCUMENTS

| | | | |
|---|---|---|---|
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 2013/0334690 | A1 | 12/2013 | Tsai et al. |
| 2014/0295673 | A1 | 10/2014 | Shero et al. |
| 2015/0221743 | A1 | 8/2015 | Ho et al. |
| 2017/0207219 | A1 | 7/2017 | Bao et al. |
| 2018/0130905 | A1 | 5/2018 | Chung et al. |
| 2018/0315756 | A1 | 11/2018 | Bao et al. |
| 2019/0067117 | A1 | 2/2019 | Chen et al. |
| 2019/0096678 | A1 | 3/2019 | Tsai et al. |
| 2019/0139954 | A1* | 5/2019 | Cheng .................. H01L 27/0886 |
| 2019/0378911 | A1* | 12/2019 | Lee ...................... H01L 29/0673 |
| 2021/0118995 | A1 | 4/2021 | Cheng et al. |

FOREIGN PATENT DOCUMENTS

| | | |
|---|---|---|
| KR | 10-2019-0140564 A | 12/2019 |
| TW | 201642326 A | 12/2016 |

* cited by examiner

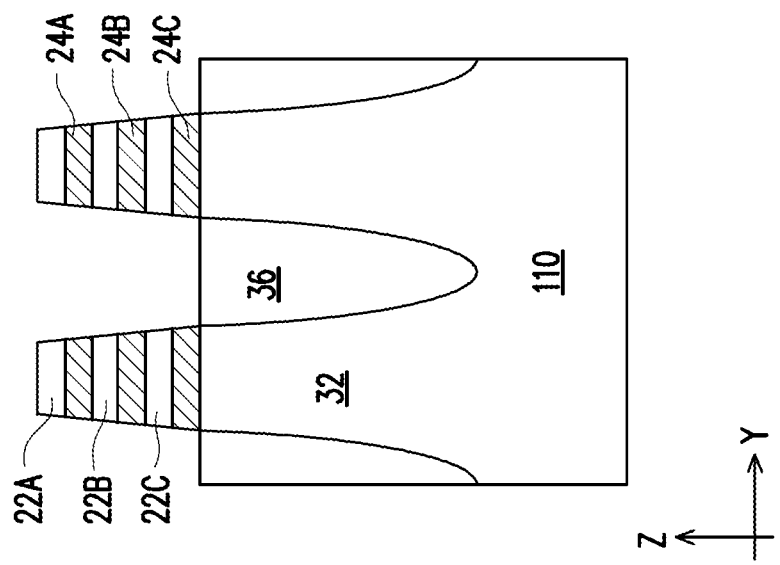
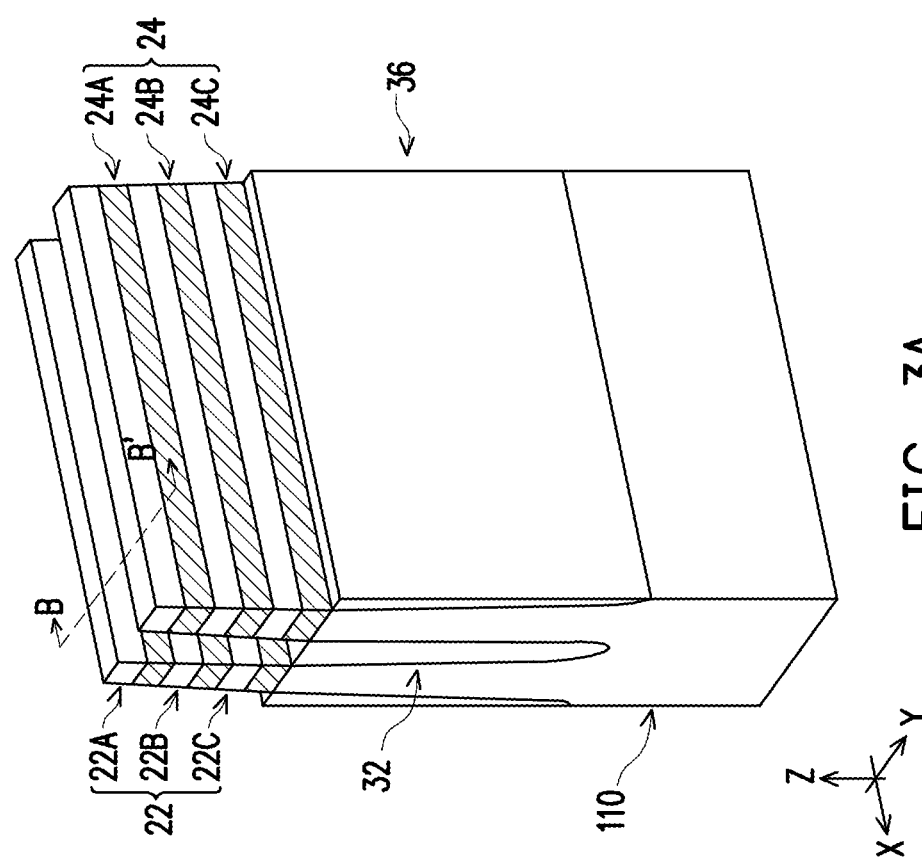
FIG. 3B
FIG. 3A

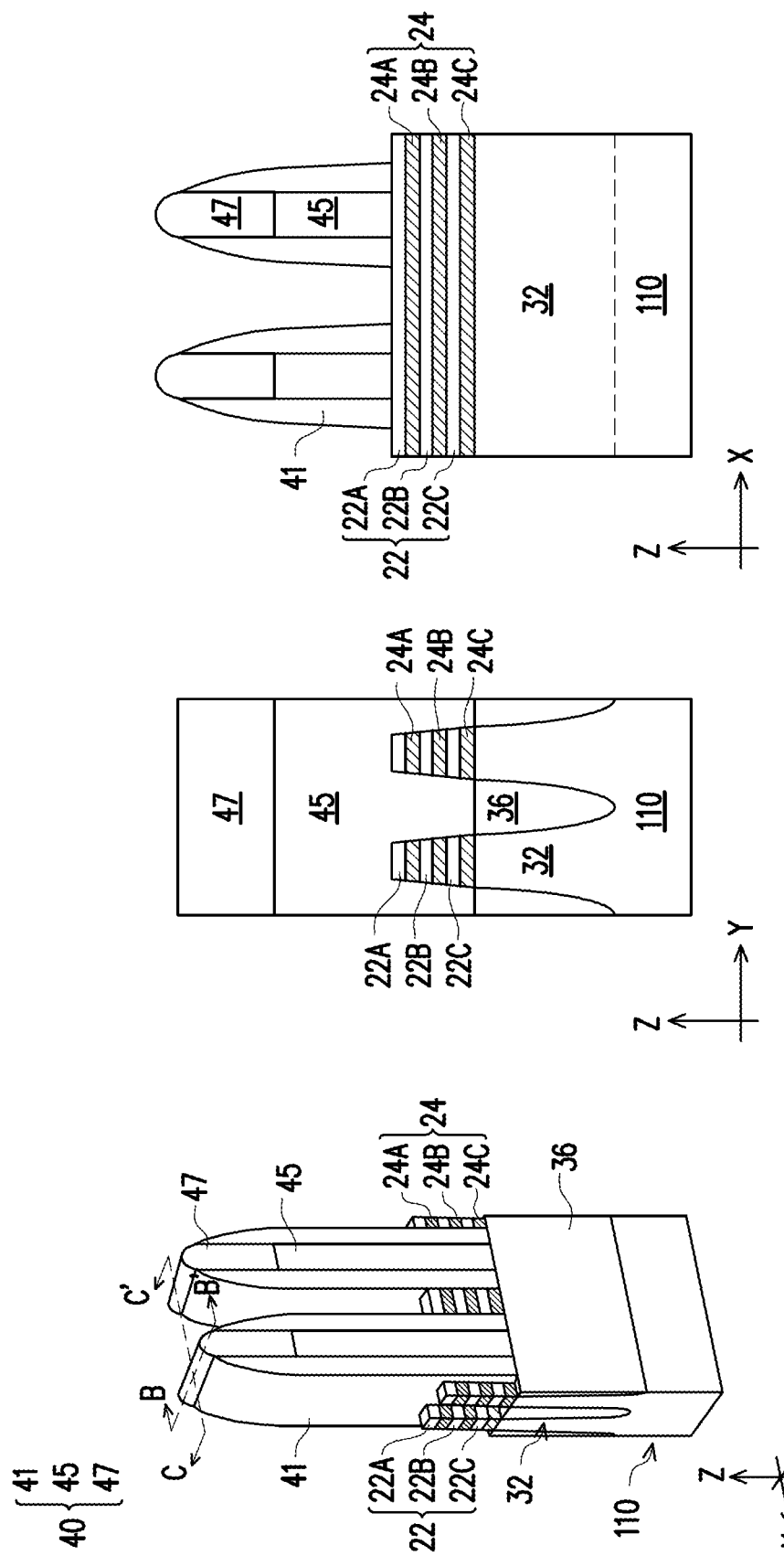

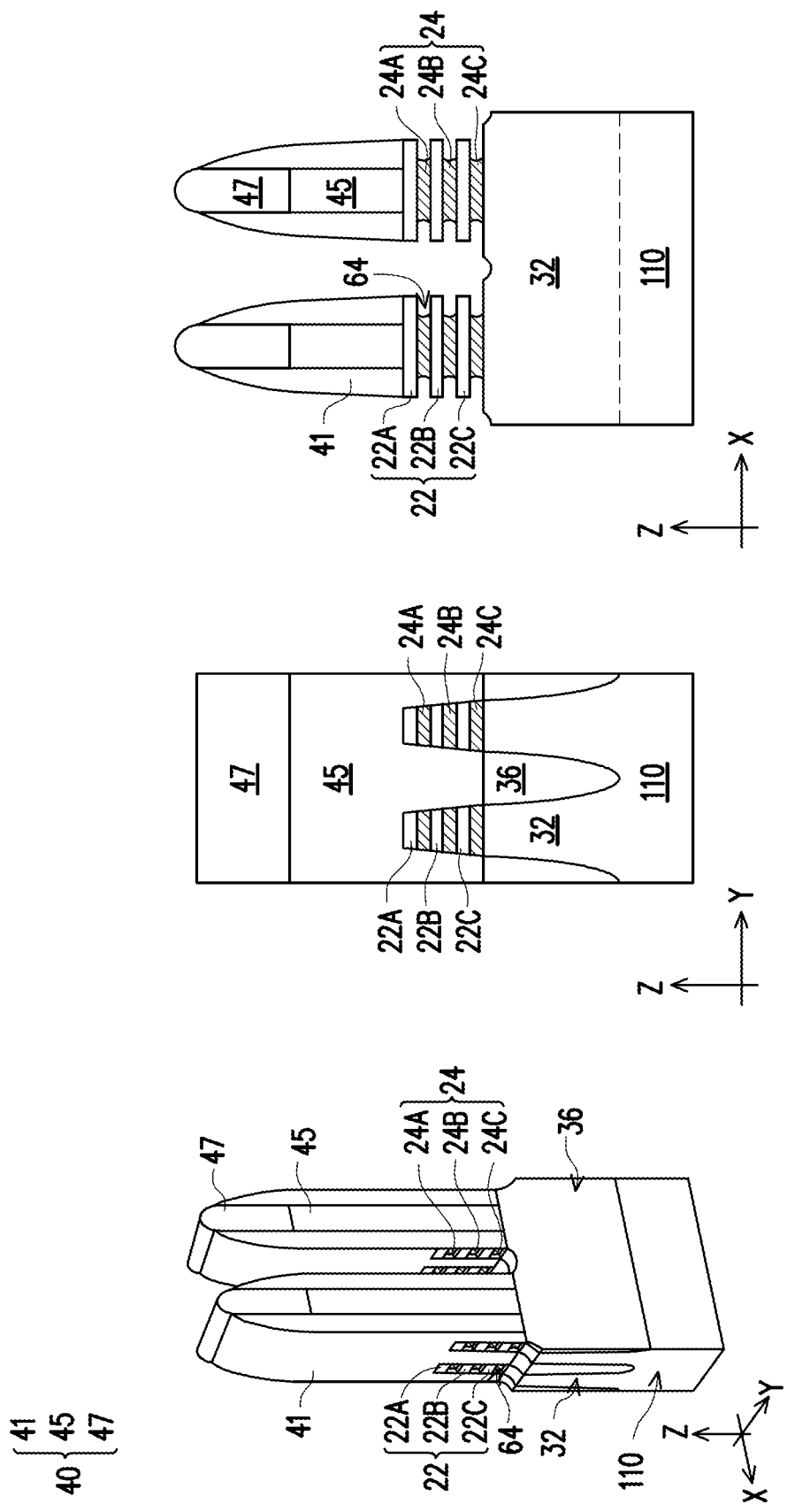

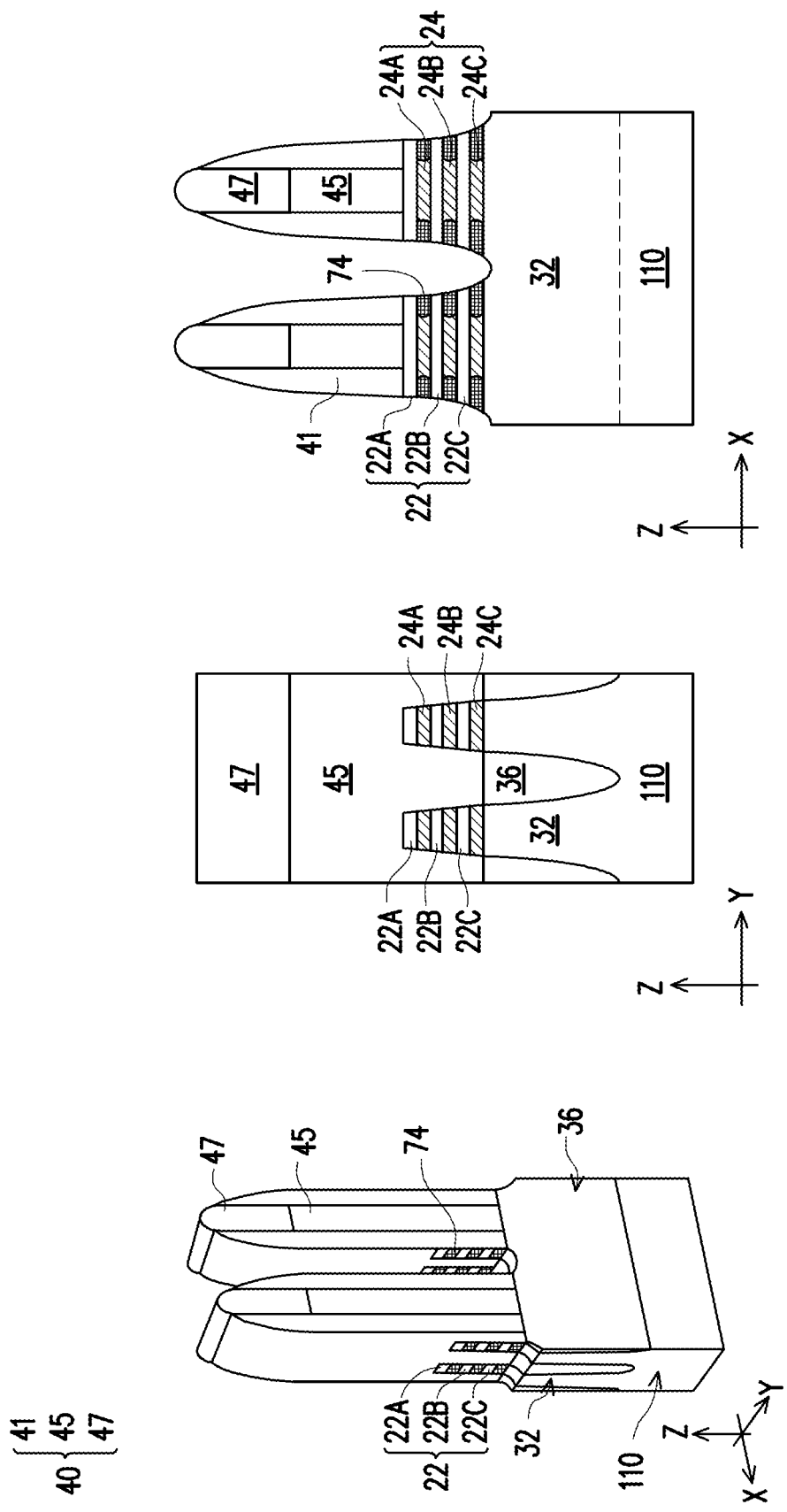

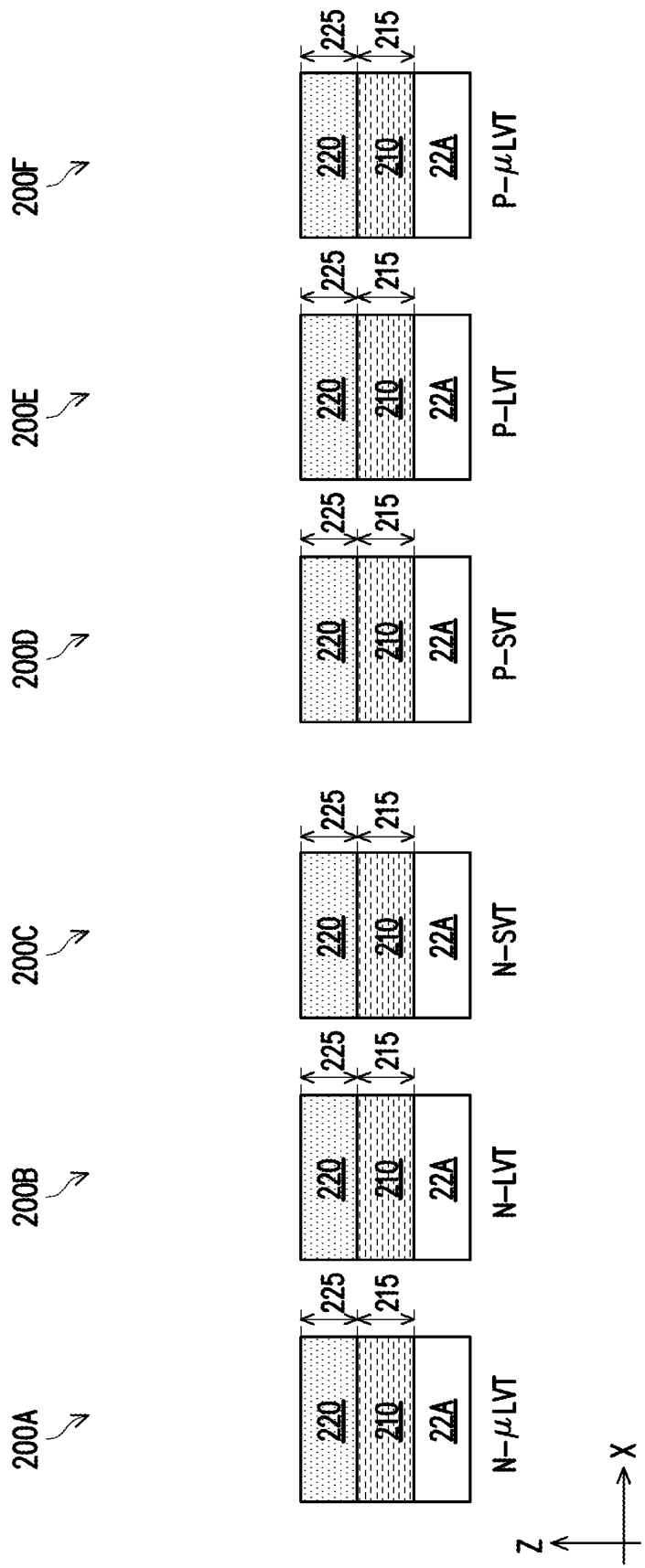

GATE STRUCTURE AND METHOD

PRIORITY CLAIM AND CROSS-REFERENCE

This application claims the benefit of priority to U.S. Provisional Application Ser. No. 63/044,274, entitled "SEMICONDUCTOR DEVICE WITH MULTIPLE GATE STACK STRUCTURE AND METHOD OF FABRICATION THE SAME," filed on Jun. 25, 2020, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-10C are views of various embodiments of an IC device of at various stages of fabrication according to various aspects of the present disclosure.

FIGS. 12A-19F are views of various embodiments of an IC device of at various stages of fabrication according to various aspects of the present disclosure.

DETAILED DESCRIPTION

Figure 1A:
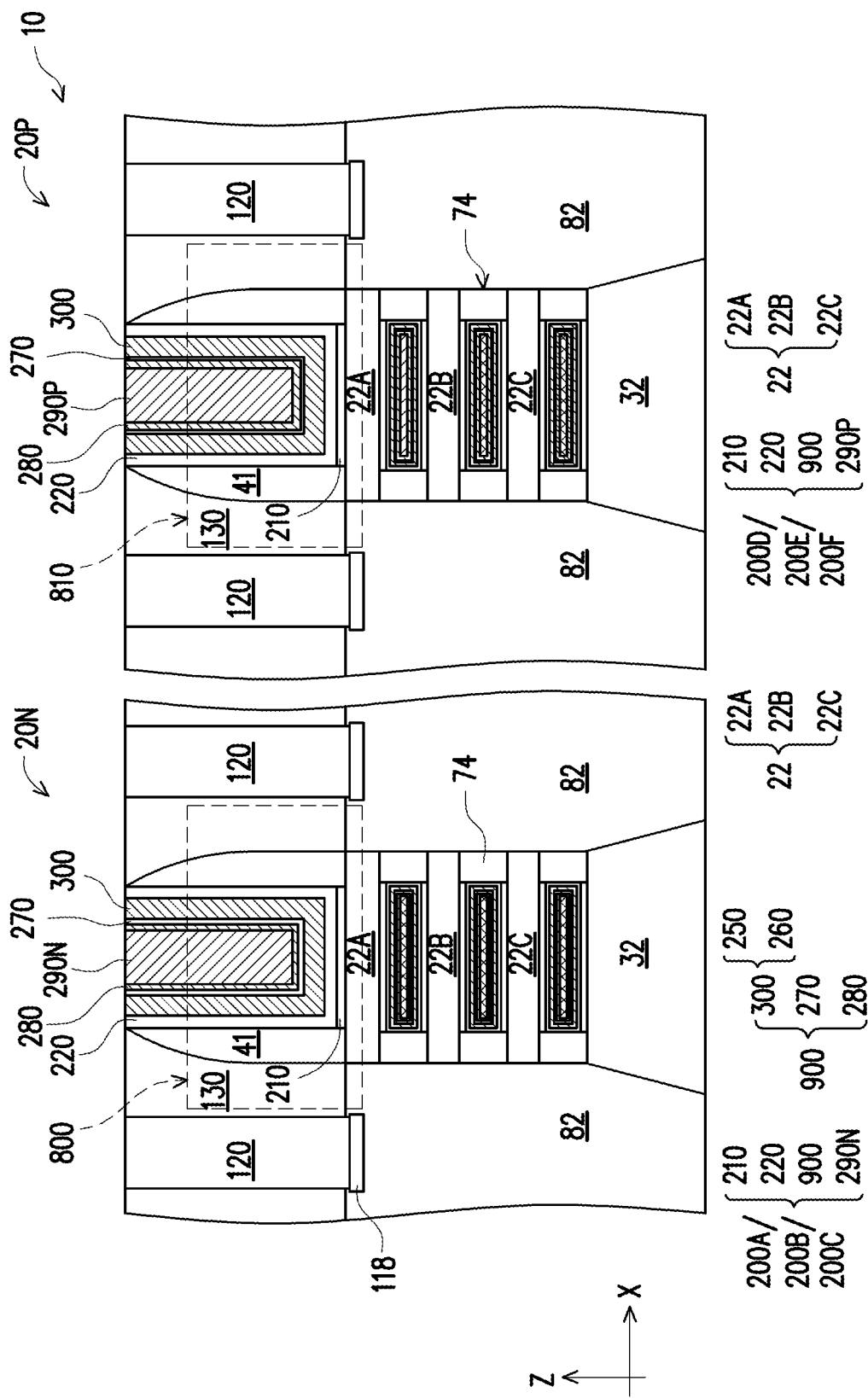
FIGS. 1A-1C are diagrammatic cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or gate-all-around (GAA) devices. Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Different threshold voltages ("Vt") of the semiconductor devices are desirable to optimize performance of circuit elements having widely different functional requirements. Threshold voltage in conventional devices may be tuned by increasing the thicknesses of different work function metals of a gate electrode. However, as the device scaling down process continues, increasing the thicknesses of different work function metals may become unfeasible and/or may lead to various manufacturing difficulties. In advanced technology nodes, gate fill window for multiple Vt tuning by varying thickness of work function metal film with photolithographic patterning becomes difficult due to gate length dimension shrinkage. Such gate fill window challenges can lead to high gate resistance, which is undesirable.

Further to the above, thinner N-type work function ("nWF") metal deposition, e.g., 10-25 Angstrom TiAlC, with thinner metal gate (5-15 Angstroms or less) multiple patterning is introduced. Thinner nWF metal, such as TiAlC, is very easily oxidized, however. N-type ultra-low threshold voltage ("ulVT") and P-type standard threshold voltage ("SVT") devices are more sensitive to nWF metal oxidation, which causes undesirable large Vt shift due to the nWF metal being deposited directly on a high-K ("HK") dielectric layer close to the Si channel. As such, additional protection layers are introduced in the embodiments to prevent metal oxidation.

Embodiments include at least four techniques for enhancing Vt tuning. First, multiple thinner metal gate layers (e.g., first and second metal gate layers) are patterned. Second, the multiple thinner metal gate layers are selectively removed with etch stop on the HK dielectric layer by an AI-controlled atomic layer etch ("ALE") process. Third, a thinner third work function ("WF") metal (e.g., TiAlC, TiN) deposition is performed with multiple protection layers. Fourth, a metal nitride glue layer deposition is added to enhance tungsten gate fill by chemical vapor deposition ("CVD").

Gate stack structures disclosed herein improve gate fill window, achieve lower gate resistance, and improve reliability for multiple Vt tuning with photolithographic patterning. As such, device performance gain is also improved. Multiple Vt tuning is achieved by selectively depositing additional protection layers between the HK dielectric layer(s) and the glue and metal fill layers. Further reliability improvement is accomplished by reducing loss of the HK dielectric layer(s).

FIG. 1A illustrates a diagrammatic cross-sectional side view of a portion of an IC device 10 fabricated according to embodiments of the present disclosure, where the IC device 10 includes gate-all-around (GAA) devices 20N, 20P. The GAA devices 20N, 20P may include at least an NFET or a PFET in some embodiments. For example, the GAA device 20N is an NFET, and the GAA device 20P is a PFET, in accordance with some embodiments. Integrated circuit devices such as the IC device 10 frequently include transistors having different threshold voltages based on their function in the IC device. For example, input/output (TO) transistors typically have the highest threshold voltages due to the high current handling required of the IO transistors. Core logic transistors typically have the lowest threshold voltages to achieve higher switching speeds at lower operating power. A third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

The cross-sectional view of the IC device 10 in FIG. 1A is taken along an X-Z plane, where the X-direction is the horizontal direction, and the Z-direction is the vertical direction. The GAA devices 20N, 20P each include channels 22A-22C (alternately referred to as "nanostructures") over a fin structure 32. The channels 22A-22C are laterally abutted by source/drain features 82, and covered and surrounded by gate structures 200A/B/C, 200D/E/F. In the following description, the gate structure 200A and the gate structure 200F are described for simplicity. The gate structures 200A, 200F control flow of electrical current through the channels 22A-22C based on voltages applied at the gate structures 200A, 200F and at the source/drain features 82. The threshold voltage is a minimum voltage (e.g., gate-source voltage or source-gate voltage) needed to establish a conducting path in the channels 22A-22C. Threshold voltage tuning during fabrication of the various transistors, e.g., IO transistors, core logic transistors, and SRAM transistors, preferably with low modification of the fabrication process, is accomplished by at least one of the techniques applied during fabrication of the gate structures 200A, 200F, described in greater detail below.

In some embodiments, the fin structure 32 includes silicon, silicon germanium, or another suitable semiconductor material. In some embodiments, the GAA device 20N is an NFET, and the source/drain features 82 thereof include silicon phosphorous (SiP). In some embodiments, the GAA device 20P is a PFET, and the source/drain features 82 thereof include silicon germanium (SiGe).

The channels 22A-22C each include a semiconductive material, for example silicon or a silicon compound, such as silicon germanium, or the like. The channels 22A-22C are nanostructures (e.g., having sizes that are in a range of a few nanometers) and may also each have an elongated shape and extend in the X-direction. In some embodiments, the channels 22A-22C each have a nano-wire/nanowire (NW) shape, a nano-sheet/nanosheet (NS) shape, a nano-tube/nanotube (NT) shape, or other suitable nanoscale shape. The cross-sectional profile of the channels 22A-22C may be rectangular, round, square, circular, elliptical, hexagonal, or combinations thereof.

In some embodiments, the lengths (e.g., measured in the X-direction) of the channels 22A-22C may be different from each other, for example due to tapering during a fin etching process. In some embodiments, length of the channel 22A may be less than a length of the channel 22B, which may be less than a length of the channel 22C. The channels 22A-22C each may not have uniform thickness, for example due to a channel trimming process used to expand spacing (e.g., measured in the Z-direction) between the channels 22A-22C to increase gate structure fabrication process window. For example, a middle portion of each of the channels 22A-22C may be thinner than the two ends of each of the channels 22A-22C. Such shape may be collectively referred to as a "dog-bone" shape.

In some embodiments, the spacing between the channels 22A-22C (e.g., between the channel 22B and the channel 22A or the channel 22C) is in a range between about 8 nanometers (nm) and about 12 nm. In some embodiments, a thickness (e.g., measured in the Z-direction) of each of the channels 22A-22C is in a range between about 5 nm and about 8 nm. In some embodiments, a width (e.g., measured in the Y-direction, not shown in FIG. 1A, orthogonal to the X-Z plane) of each of the channels 22A-22C is at least about 8 nm.

The gate structures 200A, 200F, are disposed over and between the channels 22A-22C, respectively. In some embodiments, the gate structure 200A is disposed over and between the channels 22A-22C, which are silicon channels for N-type devices, and the gate structure 200F is disposed over and between, for example, silicon germanium channels for P-type devices.

A first interfacial layer ("IL") 210, which may be an oxide of the material of the channels 22A-22C, is formed on exposed areas of the channels 22A-22C and the top surface of the fin 32. The first IL 210 promotes adhesion of the gate dielectric layer 220 to the channels 22A-22C. In some embodiments, the first IL 210 has thickness of about 5 Angstroms (A) to about 50 Angstroms (A). In some embodiments, the first IL 210 has thickness of about 10 A. The first IL 210 having thickness that is too thin may exhibit voids or insufficient adhesion properties. The first IL 210 being too thick consumes gate fill window, which is related to threshold voltage tuning, resistance and reliability as described above.

The gate dielectric layer 220 includes a high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 220 has thickness of about 5 A to about 100 A. In some embodiments, the gate dielectric layer 220 comprises at least two HK layers, such as a first high-k dielectric layer including, for example, $HfO_2$ with dipole doping (e.g., La, Mg), and a second high-k dielectric layer including, for example, ZrO with crystallization, which is a higher-k material than HfO$_2$. Other suitable combinations of high-k dielectric layers including other suitable materials may also be substituted.

The gate structures 200A, 200F further include one or more work function metal layers 300, a protection layer structure 270, and a glue layer 280, which may be referred to collectively as the work function metal layer structure 900. In the GAA device 20N, which is an NFET in most embodiments, the work function metal layer structure 900 may include at least an N-type work function metal layer, an in-situ capping layer, and an oxygen blocking layer. In some embodiments, the work function metal layer structure 900 includes more or fewer layers than those described.

The gate structures 200A, 200F also include metal fill layers 290N, 290P. The metal fill layers 290N, 290P may include a conductive material such as tungsten, cobalt, ruthenium, iridium, molybdenum, copper, aluminum, or combinations thereof. Between the channels 22A-22C, the metal fill layers 290N, 290P are circumferentially surrounded (in the cross-sectional view) by the work function metal layer structure 900, which are then circumferentially surrounded by the gate dielectric layer 220. In the portion of the gate structures 200A, 200F formed over the channel 22A most distal from the fin 32, the metal fill layers 290N, 290P are formed over the work function metal layer structure 900. The work function metal layer structure 900 wraps around the metal fill layers 290N, 290P. The gate dielectric layer 220 also wraps around the work function metal layer structure 900.

The GAA devices 20N, 20P also include gate spacers 41 and inner spacers 74 that are disposed on sidewalls of the gate dielectric layer 220. The inner spacers 74 are also disposed between the channels 22A-22C. The gate spacers 41 and the inner spacers 74 may include a dielectric material, for example a low-k material such as SiOCN, SiON, SiN, or SiOC.

The GAA devices 20N, 20P further include source/drain contacts 120 that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may contain a metal silicide material, such as cobalt silicide in some embodiments, or TiSi in some other embodiments.

The GAA devices 20N, 20P further include an interlayer dielectric (ILD) 130. The ILD 130 provides electrical isolation between the various components of the GAA devices 20N, 20P discussed above, for example between the gate structures 200A, 200F and the source/drain contacts 120.

Figure 1B:
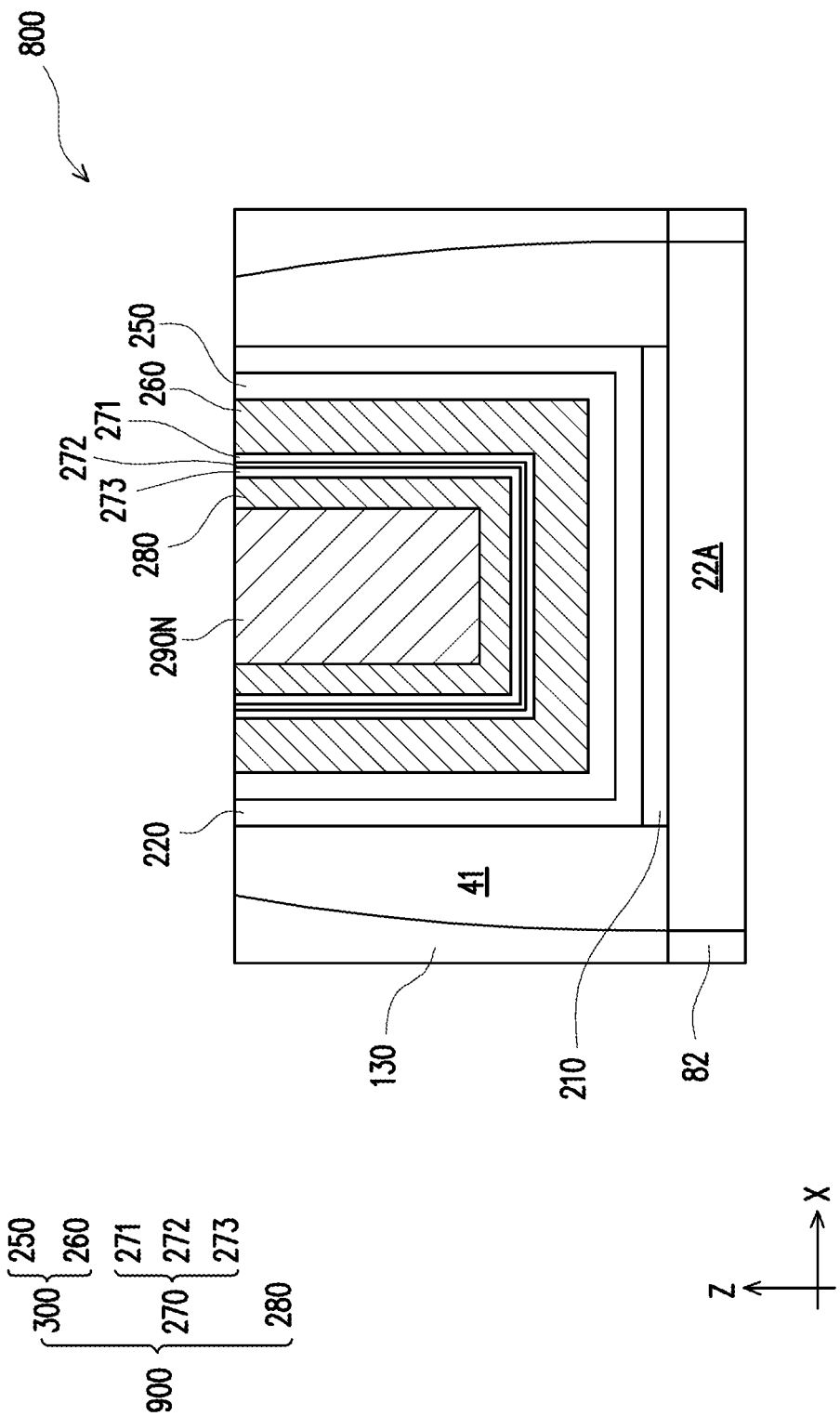
Figure 1C:
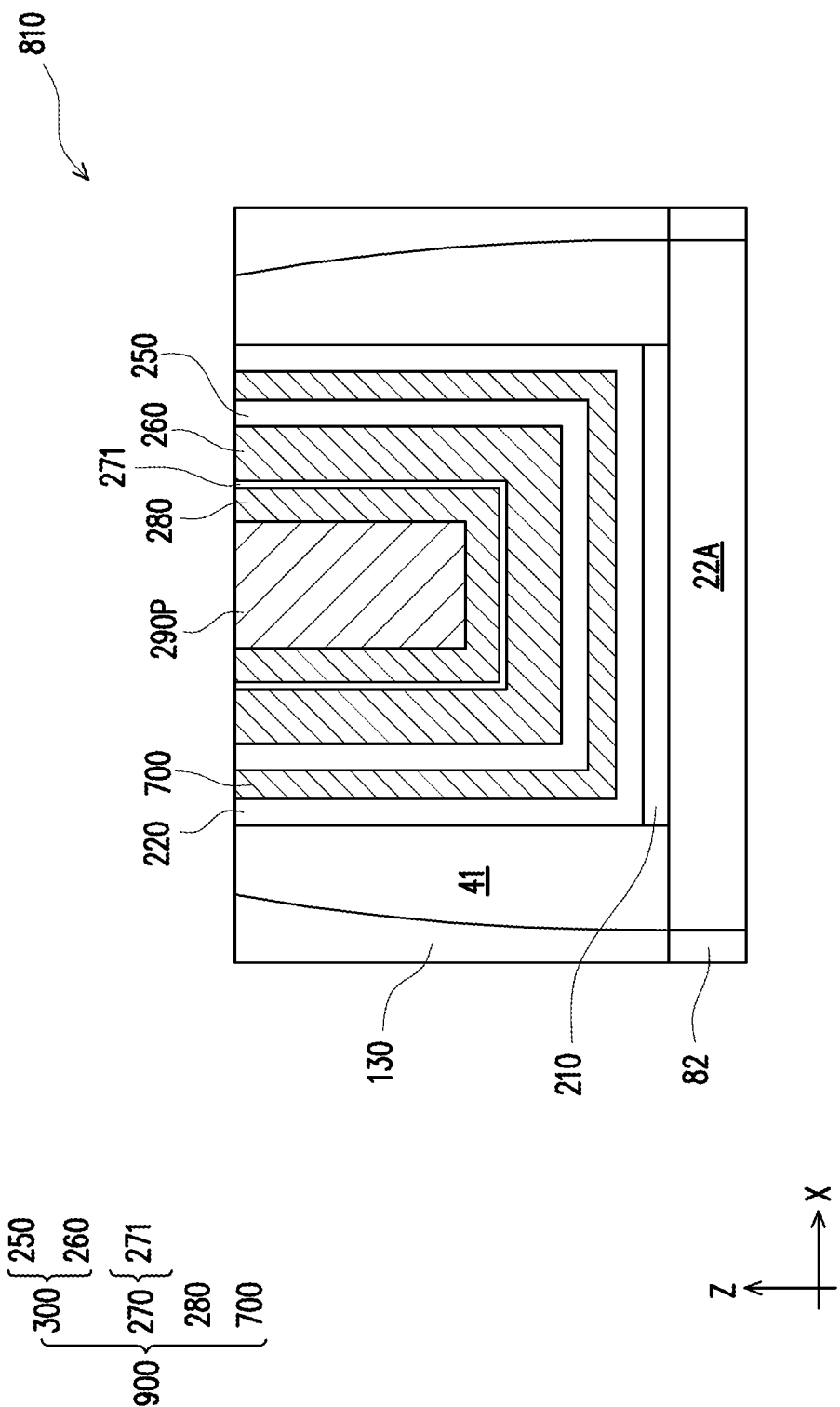

Regions 800, 810 highlighted in FIG. 1A are shown in expanded view in FIG. 1B and FIG. 1C, respectively. FIG. 1B illustrates the gate structure 200A in greater detail, and FIG. 1C illustrates the gate structure 200F in greater detail. In some embodiments, the gate structure 200A corresponds to an ultra-low-Vt, N-type GAA FET. In some embodiments, the gate structure 200F corresponds to an ultra-low-Vt, P-type GAA FET.

As shown in FIG. 1B, the gate structure 200A includes the first IL 210 on the channel 22A, the gate dielectric layer 220, a first WF metal layer 250, and a capping layer 260. In some embodiments, the channel 22A is a Si channel for the GAA device 20N, which is an N-type device. In the gate structure 200A, the protection layer structure 270 includes a first protection layer 271, a second protection layer 272, and a third protection layer 273, which may be referred to collectively as the protection layers. The protection layer structure 270 isolates the first WF metal layer 250 from the glue layer 280 and the metal fill layer 290N. Including three protection layers 271, 272, 273 prevents oxidation of the first WF metal layer 250, and avoids undesirable shift (increase) in the threshold voltage of the GAA device 20N. In some embodiments, each of the protection layers 271, 272, 273 is or comprises a metal or a conductive metal oxide. In some embodiments, the first protection layer 271 may be Si, Ge, SiGe, Al, Ti, Hf, or other suitable material, which can block oxygen diffusion into the WF metal layers 300 to prevent oxidation of, for example, the first WF metal layer 250. In some embodiments, the second and/or third protection layers 272, 273 may be or include metal or a conductive metal oxide, such as Ti, Al, Hf, RuO$_2$, IrO2 or the like. In some embodiments, the first protection layer 271 and the second and/or third protection layers 272, 273 are or include the same material(s). In some embodiments, materials of the first protection layer 271 and the second and/or third protection layers 272, 273 are different. Thickness of the first protection layer 271 may be less than or equal to thickness of the second and/or third protection layers 272, 273.

In some embodiments, the first IL 210 comprises at least one element of substrate material, e.g., silicon. In some embodiments, the first WF layer 250 comprises TiAlC, TiAl, TaAlC, TaAl, or the like. In some embodiments, the capping layer 260 includes TiN, TiSiN, TaN, WN, MoN, WCN, or the like. In some embodiments, the glue layer 280 comprises a metal nitride, such as TiN, TaN, MoN, WN, or the like, for better W adhesion. In some embodiments, the metal fill layer 290N comprises W, Co, Ru, Ir, Mo, Cu, another low resistivity metal, or the like, as a gate fill material.

As shown in FIG. 1C, the gate structure 200F includes the first IL 210 on the channel 22A, the gate dielectric layer 220, a first WF metal layer 250, and a capping layer 260. In some embodiments, the channel 22A is a SiGe channel for the GAA device 20P, which is a P-type device. In the gate structure 200F, the protection layer structure 270 includes the first protection layer 271, and is free of the second protection layer 272 and the third protection layer 273. The protection layer structure 270 including only the single first protection layer 271 isolates the first WF metal layer 250 from the glue layer 280 and the metal fill layer 290P less than the tri-layer protection layer structure 270 included in the gate structure 200A. Including the single first protection layer 271 prevents less oxidation of the first WF metal layer 250, allowing a moderate Vt shift (decrease) in the GAA device 20P, which is desirable for the uLVT, P-type GAA device 20P including the gate structure 200F. Similar to described above, the first protection layer 271 is or comprises a metal or a conductive metal oxide. In some embodiments, the first protection layer 271 may be Si, Ge, SiGe, Al, Ti, Hf, or other suitable material.

An additional second work function layer 700 generally includes one or more barrier layers. Each barrier layer may include Ti, Ta, W, Mo, O, C, N, Si, or the like. In some embodiments, each barrier layer includes a metal compound, such as TiN, TaN, WN, MoN, WCN, TiSiN, or the like. In some embodiments, the second work function layer 700 includes at least a first barrier layer and a second barrier layer (not separately illustrated for simplicity). In some embodiments, the first barrier layer and the second barrier layer are or include the same material. In some embodiments, the first barrier layer and the second barrier layer are or include different materials. In some embodiments, thickness of the first barrier layer is substantially equal to thickness of the second barrier layer (e.g., <1% difference). In some embodiments, the thickness of the first barrier layer is different from the thickness of the second barrier layer. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude). Based on the above discussion, as an uLVT, N-type GAA device, the GAA device 20N comprising the gate structure 200A is free of additional barrier layers, so as not to cause an undesirable increase in the threshold voltage.

As described above with respect to the gate structure 200A of FIG. 1B, in some embodiments, the first IL 210 of the gate structure 200F of FIG. 1C comprises at least one element of substrate material, e.g., silicon. In some embodiments, the first WF layer 250 comprises TiAlC, TiAl, TaAlC, TaAl, or the like. In some embodiments, the capping layer 260 includes TiN, TiSiN, TaN, WN, MoN, WCN, or the like. In some embodiments, the glue layer 280 comprises a metal nitride, such as TiN, TaN, MoN, WN, or the like, for better W adhesion. In some embodiments, the metal fill layer 290N comprises W, Co, Ru, Ir, Mo, Cu, another low resistivity metal, or the like, as a gate fill material.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 10A:
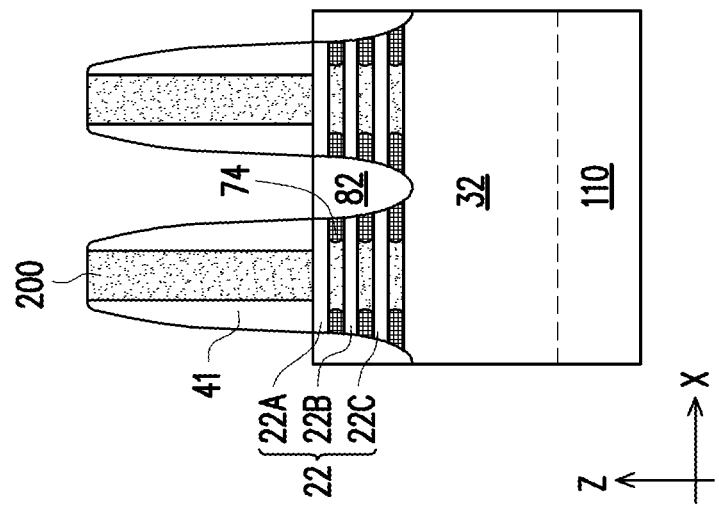
Figure 10B:
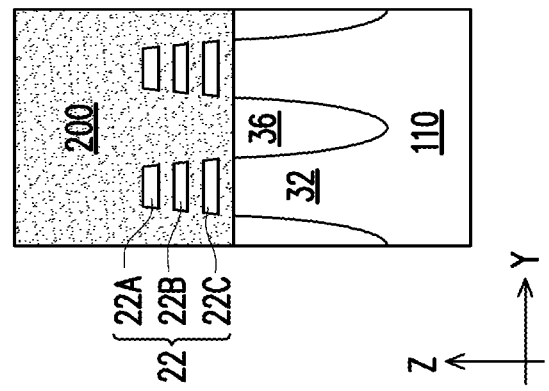
Figure 10C:
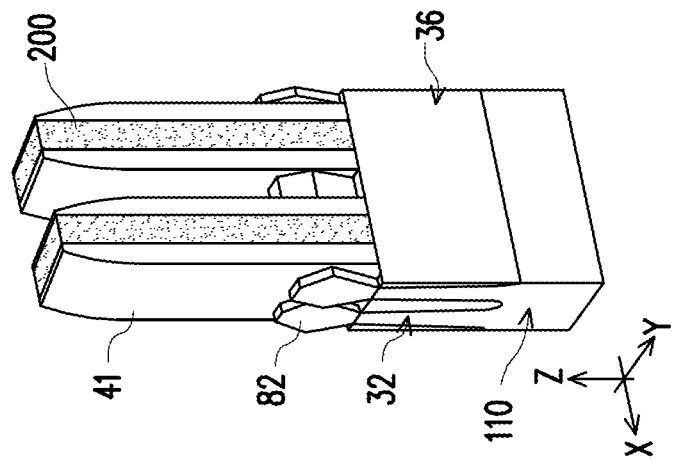
Figure 11:
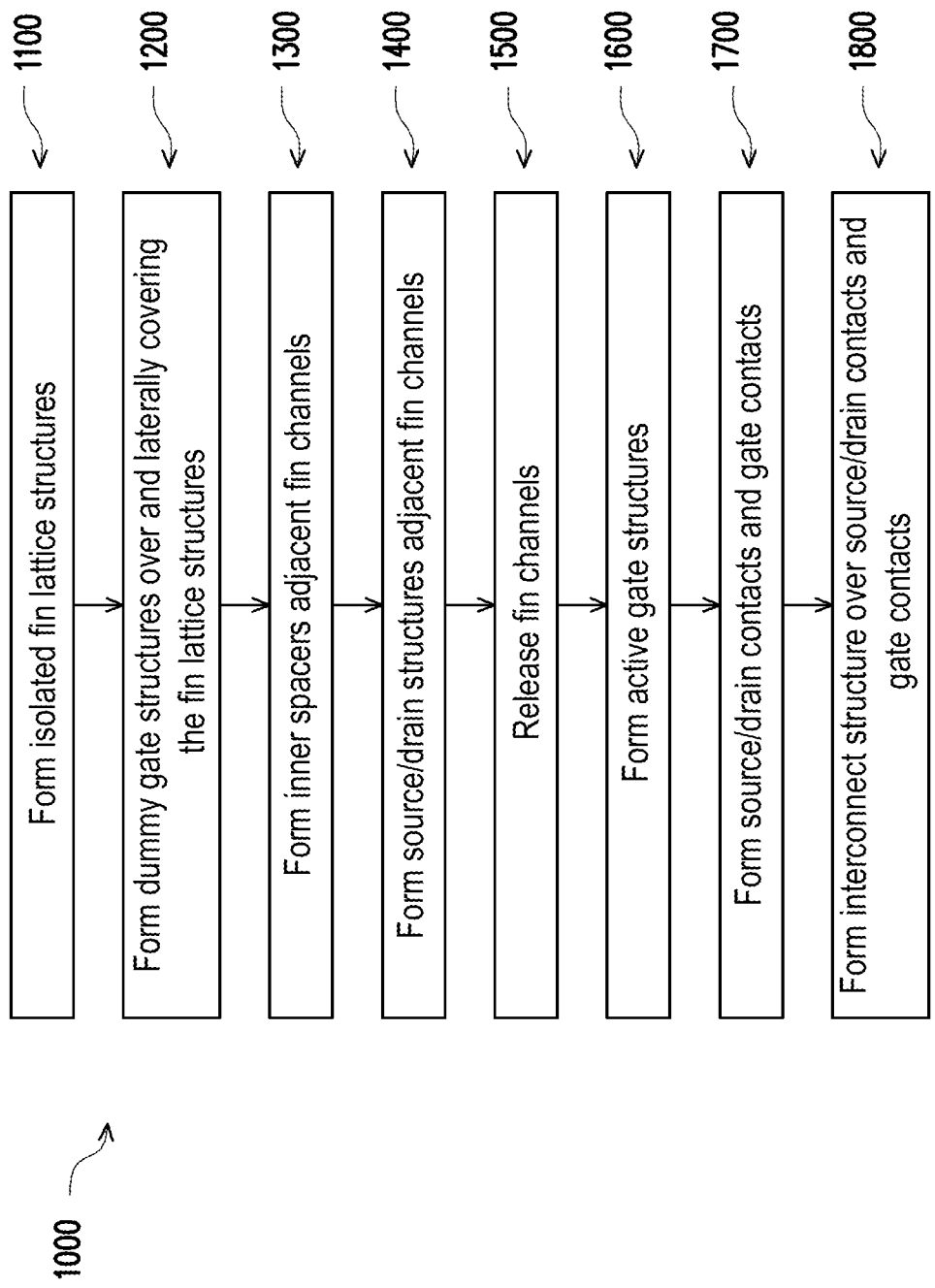
FIG. 11 is a flowchart illustrating a method of fabricating a semiconductor device according to various aspects of the present disclosure.

FIG. 11 illustrates a flowchart illustrating a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary cross-sectional views of a workpiece (shown in FIGS. 2A-2B, 3A-3B, 4A-4C, 5A-5C, 6A-6C, 7A-7C, 8A-8C, 9A-9C, and 10A-10C) at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 10C are perspective views and cross-sectional views of intermediate stages in the manufacturing of nano-FETs, in accordance with some embodiments. FIGS. 2A, 3A, 4A, 5A, 6A, 7A, 8A, 9A, and 10A illustrate perspective views. FIGS. 2B, 3B, 4B, 5B, 6B, 7B, 8B, 9B, and 10B illustrate reference cross-section B-B' (gate cut) illustrated in FIGS. 2A, 3A, and 4A. FIGS. 4C, 5C, 6C, 7C, 8C, 9C, and 10C illustrate reference cross-section C-C' (channel/fin cut) illustrated in FIG. 4A.

Figure 2B:
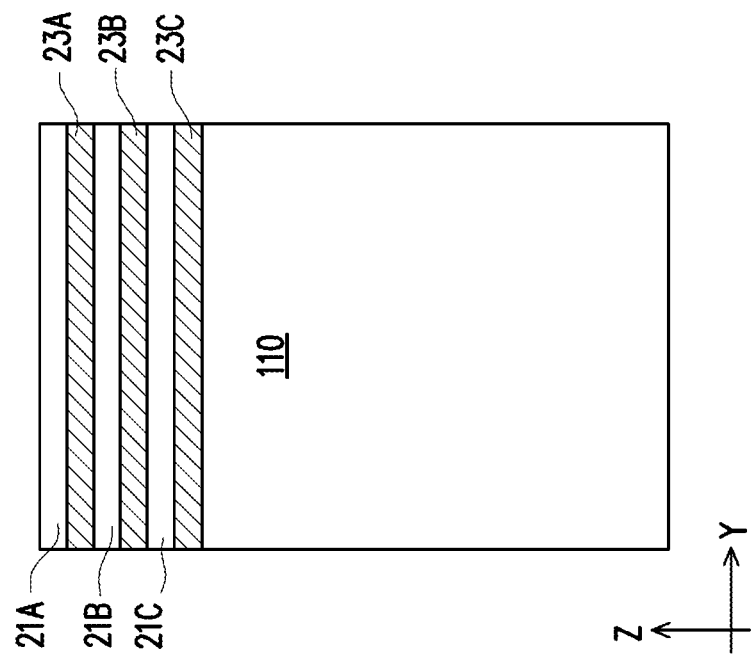
Figure 2A:
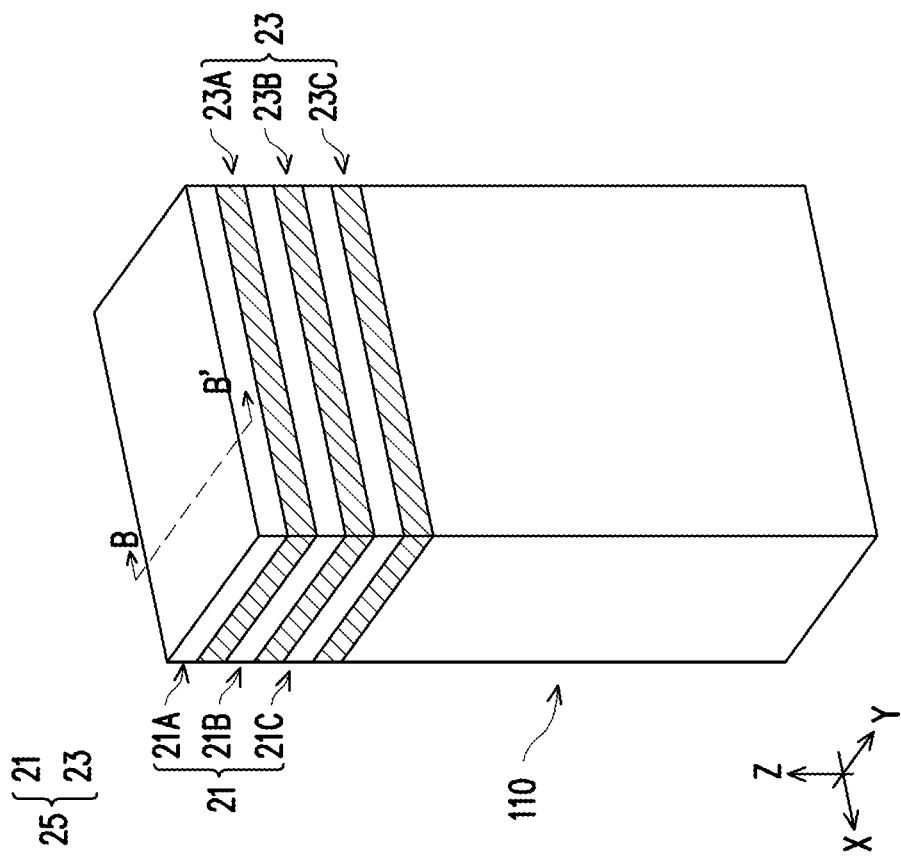

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 3A and FIG. 3B, fins 32 are formed in the substrate 110 and nanostructures 22, 24 are formed in the multi-layer stack 25 corresponding to act 1100 of FIG. 11. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CD1 between adjacent fins 32 and nanostructures 22, 24 may be from about 18 nm to about 100 nm.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 66 and the nanostructures 55. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

In FIGS. 4A-4C, dummy gate structures 40 are formed over the fins 32 and/or the nanostructures 22, 24, corresponding to act 1200 of FIG. 11. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as any of the gate structures 200A-200F.

Figures 5A, 5B, 5C:
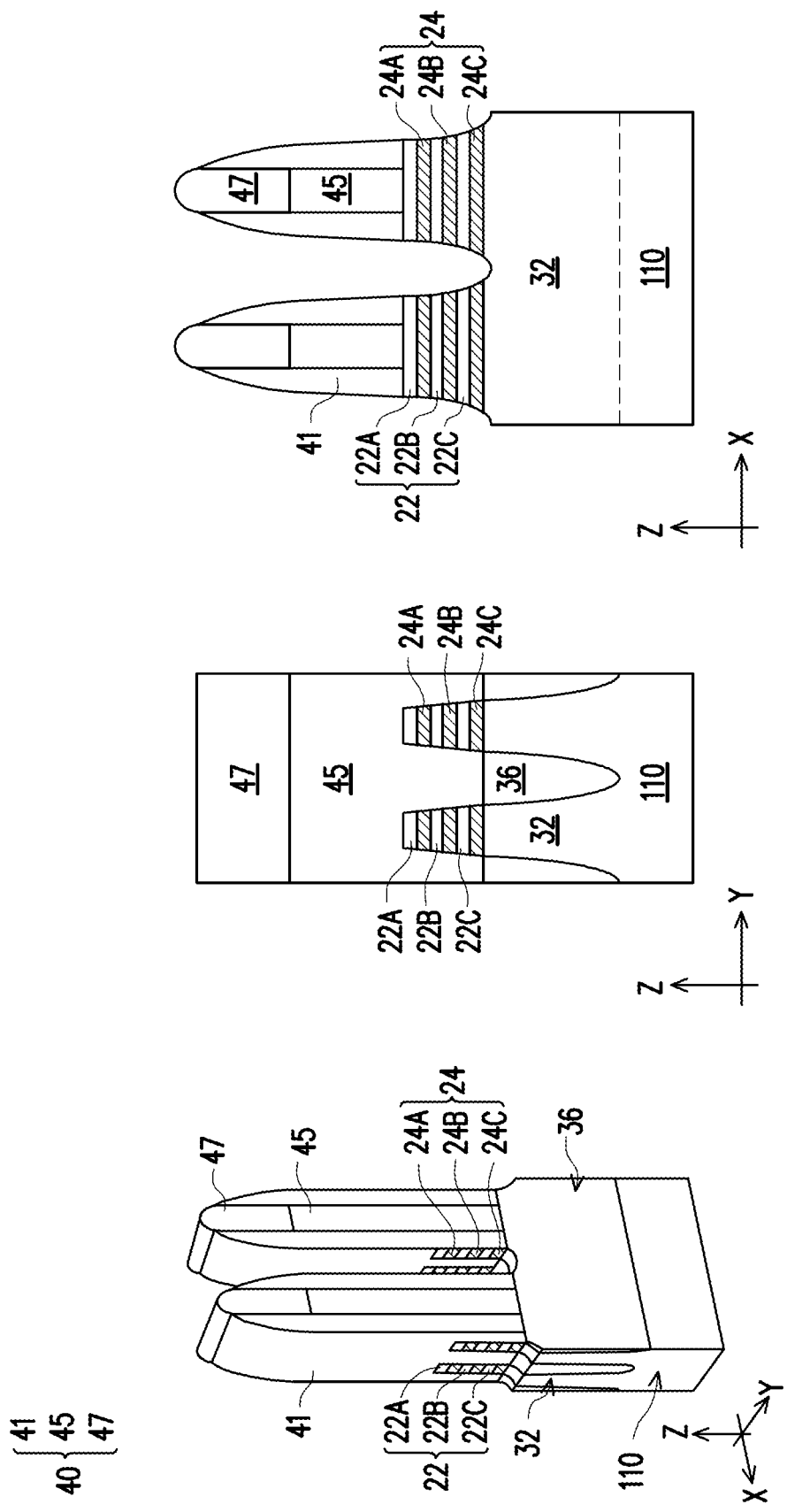

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments.

FIGS. 6A-6C and 7A-7C illustrate formation of inner spacers 74 corresponding to act 1300 of FIG. 11. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A-6C.

Next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C.

Figure 8C:
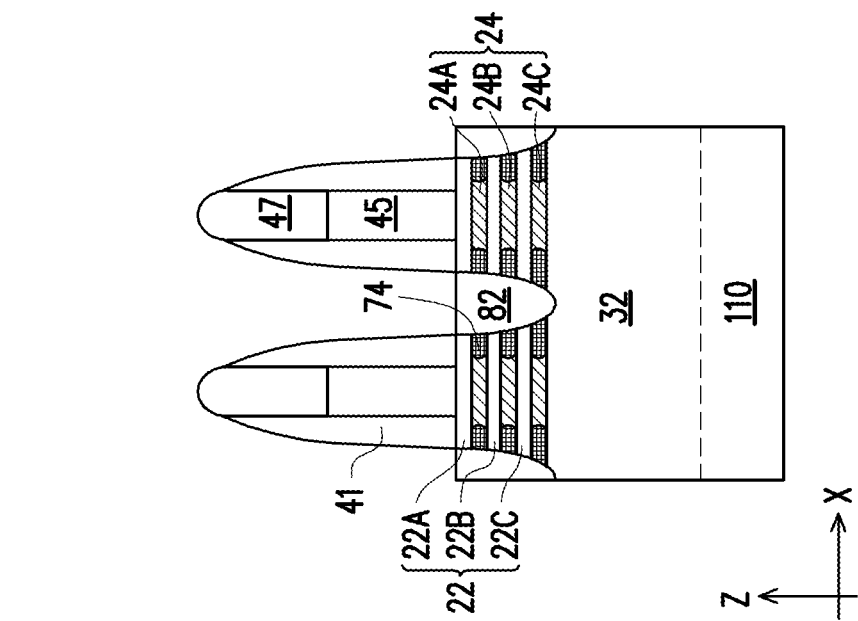
Figure 8B:
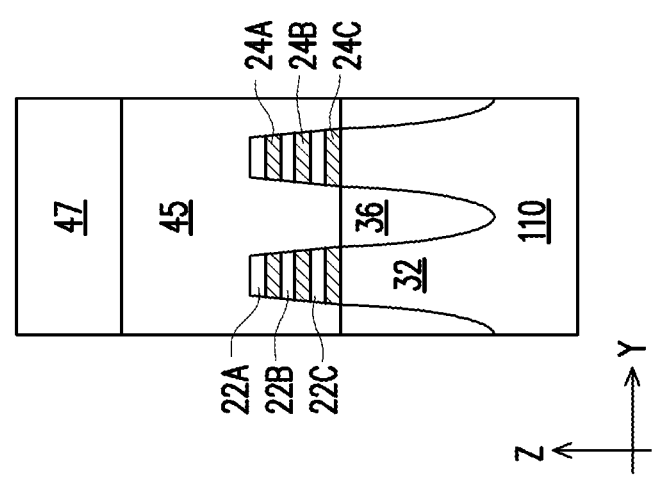
Figure 8A:
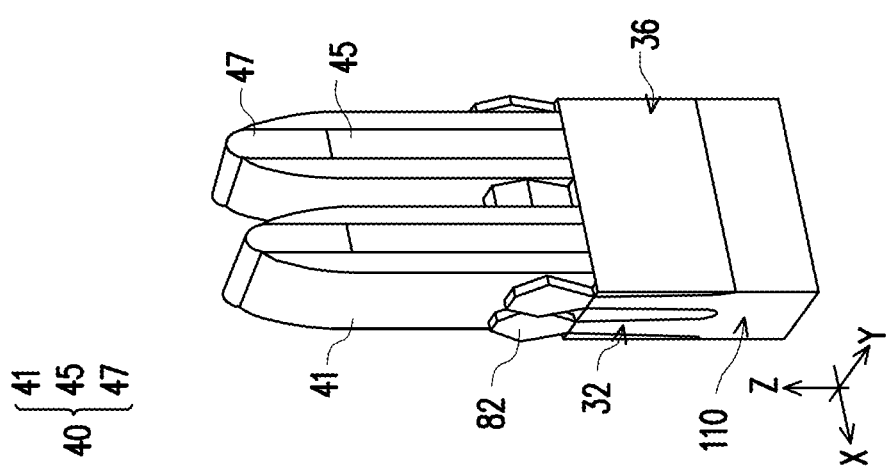

FIGS. 8A-8C illustrate formation of source/drain regions 82 corresponding to act 1400 of FIG. 11. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

Figure 9A:
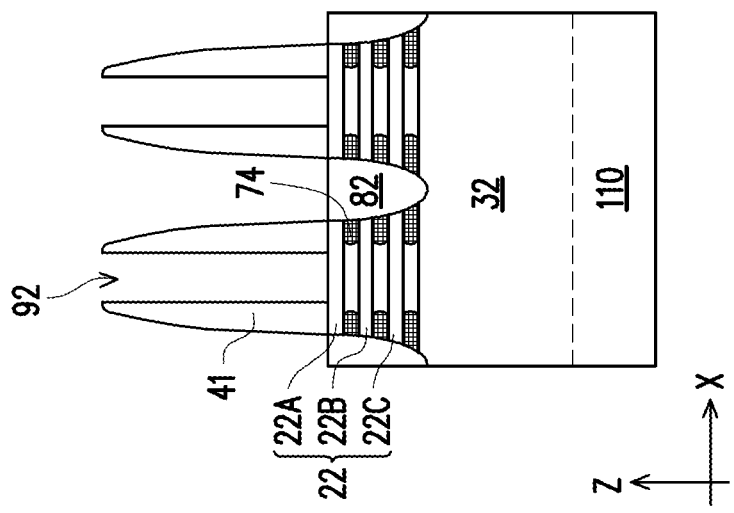
Figure 9B:
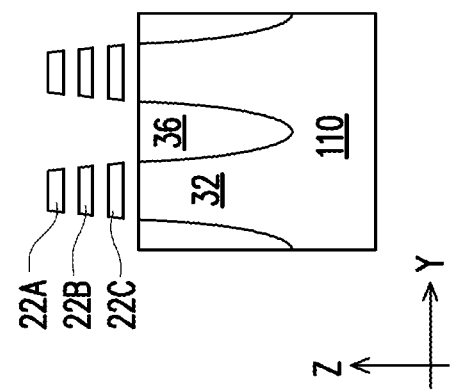
Figure 9C:
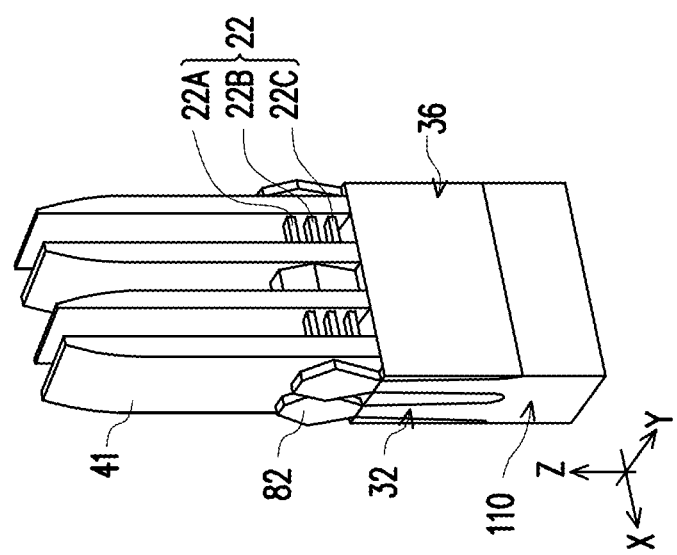

FIG. 9A, FIG. 9B, and FIG. 9C illustrate release of fin channels 22A-22C by removal of the nanostructures 24A-24C, the mask layer 47, and the dummy gate layer 45, which corresponds to act 1500 of FIG. 11. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20N, 20P formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs, such as the GAA device 20P and the GAA device 20N, respectively. However, in some embodiments the nanostructures 24 may be removed and the nanostructures 22 may be patterned to form channel regions of the GAA device 20N, and nanostructures 22 may be removed and the nanostructures 24 may be patterned to form channel regions of the GAA device 20P. In some embodiments, the nanostructures 22 may be removed and the nanostructures 24 may be patterned to form channel regions of the GAA device 20N, and the nanostructures 24 may be removed and the nanostructures 22 may be patterned to form channel regions of the GAA device 20P. In some embodiments, the nanostructures 22 may be removed and the nanostructures 24 may be patterned to form channel regions of both PFETs and NFETs.

In some embodiments, the nanosheets 22 of the GAA devices 20N, 20P are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 20:
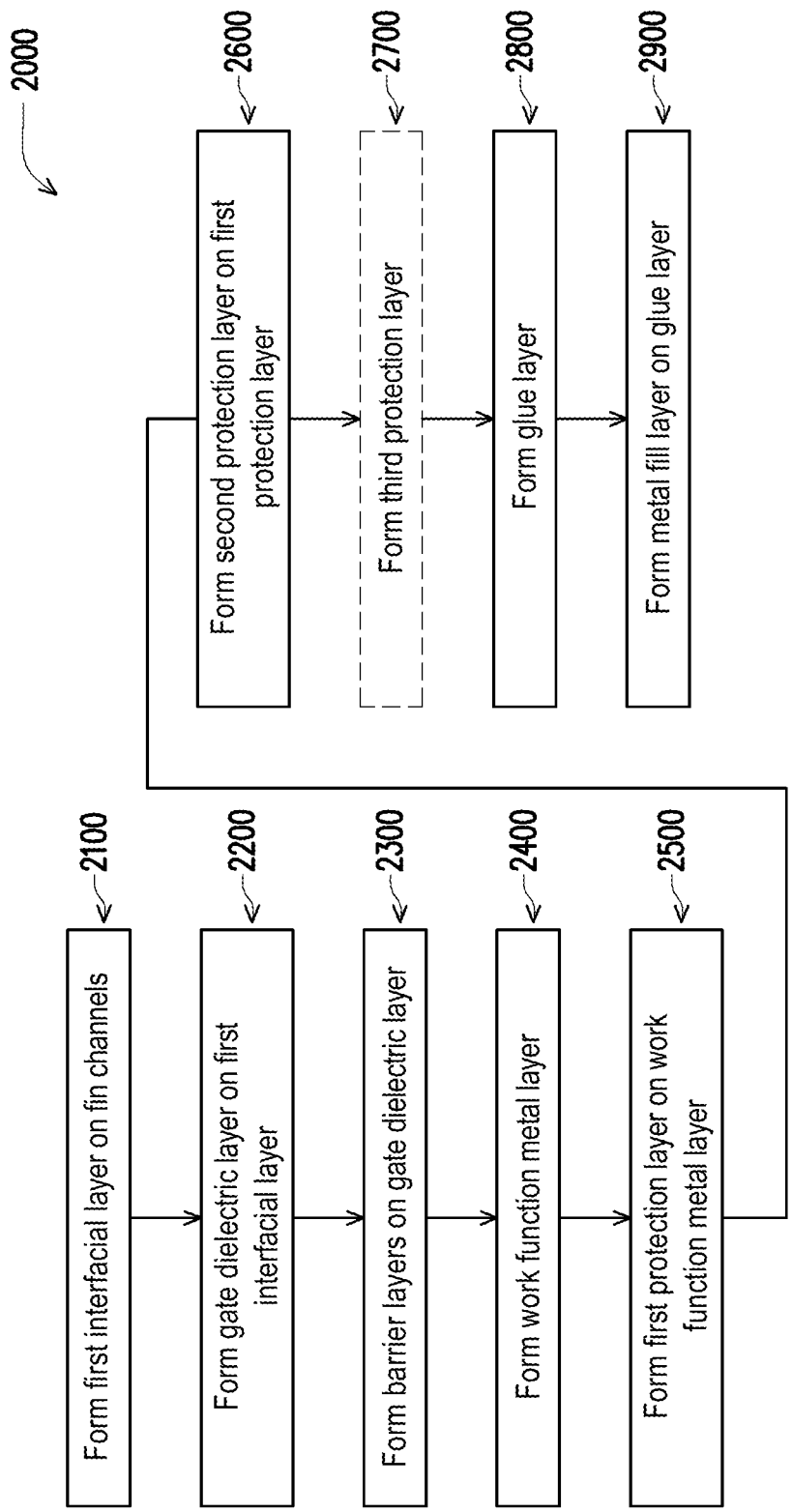
FIG. 20 is a flowchart illustrating a method of fabricating a semiconductor device according to various aspects of the present disclosure.
Figure 21:
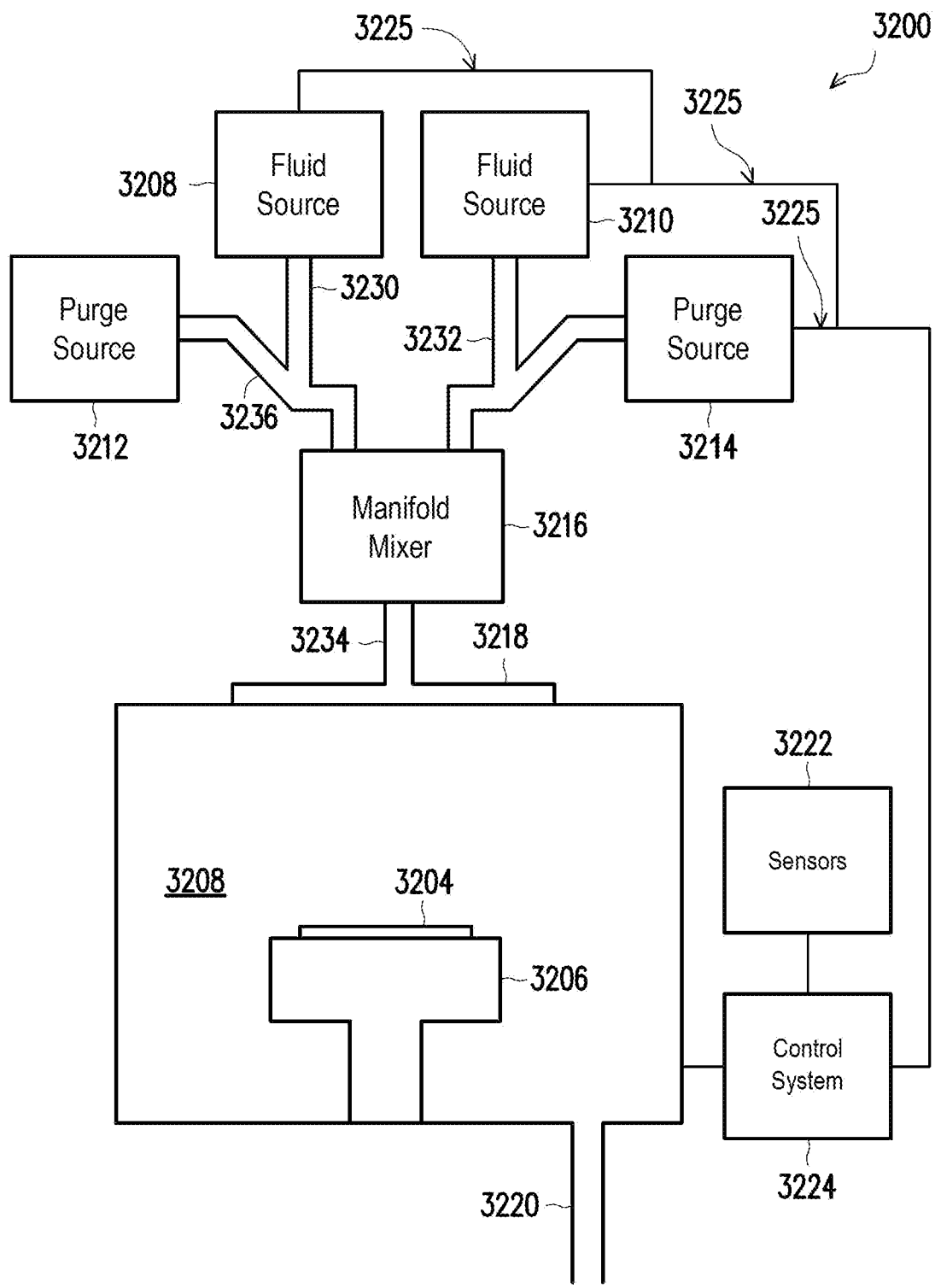
FIGS. 21-26 are diagrams of a process for fabricating a semiconductor device layer according to various aspects of the present disclosure.

Next, in FIGS. 10A-10C, replacement gates 200, such as the gate structures 200A, 200F, are formed, corresponding to act 1600 of FIG. 11. Each replacement gate 200 generally includes the first IL 210, the gate dielectric layer 220, the work function metal layers 300, the protection layer structure 270, and the gate fill layer 290N or 290P. In some embodiments, the replacement gate 200 further includes the second work function layer 700. Cross-sections of formation of the gate structures 200A, 200F, as well as further gate structures 200B, 200C, 200D, and 200E are provided with respect to FIG. 12A through FIG. 19F. Flowcharts of methods of formation of the gate structures 200A-200F are illustrated in FIG. 20 and FIG. 21.

Additional processing may be performed to finish fabrication of the GAA device 20N and/or the GAA device 20P. For example, gate contacts (not illustrated for simplicity) and the source/drain contacts 120 may be formed to electrically couple to the gate structures 200A-200F and the source/drain regions 82, respectively, corresponding to act 1700 of FIG. 11. An interconnect structure may then be formed over the source/drain contacts 120 and the gate contacts corresponding to act 1800 of FIG. 11. The interconnect structure may include a plurality of dielectric layers surrounding metallic features, including conductive traces and conductive vias, which form electrical connection between devices on the substrate 110, such as the GAA devices 20N, 20P, as well as to IC devices external to the IC device 10.

FIG. 12A through FIG. 19F illustrate formation of the gate structures 200A-200F in accordance with various embodiments. FIGS. 12A, 13A, 14A, 15A, 16A, 17A, 18A, 19A illustrate formation of an N-type ultra low threshold voltage (N-uLVT) gate structure, such as the gate structure 200A. FIGS. 12B, 13B, 14B, 15B, 16B, 17B, 18B, 19B illustrate formation of an N-type low threshold voltage (N-LVT) gate structure, such as the gate structure 200B. FIGS. 12C, 13C, 14C, 15C, 16C, 17C, 18C, 19C illustrate formation of an N-type standard threshold voltage (N-SVT) gate structure, such as the gate structure 200C. FIGS. 12D, 13D, 14D, 15D, 16D, 17D, 18D, 19D illustrate formation of a P-type standard threshold voltage (P-SVT) gate structure, such as the gate structure 200D. FIGS. 12E, 13E, 14E, 15E, 16E, 17E, 18E, 19E illustrate formation of a P-type low threshold voltage (P-LVT) gate structure, such as the gate structure 200E. FIGS. 12F, 13F, 14F, 15F, 16F, 17F, 18F, 19F illustrate formation of a P-type ultra low threshold voltage (P-uLVT) gate structure, such as the gate structure 200F. FIG. 20 illustrates a flowchart of a process 2000 for forming the gate structures 200A-200F.

The gate structures 200A-200F may be formed on the same wafer and/or may be parts of the same IC device in some embodiments. As such, at least some of the fabrication processes discussed below may be performed to all the gate structure 200A-200F simultaneously. In FinFET embodiments, the gate structures 200A-200F may also be each formed over fin structures, such that the gate structures 200A-200F each wrap around a portion of the fin structures.

In GAA FET embodiments, the gate structures 200A-200F may wrap around channel regions of the fin structures. In some embodiments, the gate structures 200A, 200B, 200C correspond to N-type ultra-low threshold voltage (N-uLVT), low threshold voltage (N-LVT), and standard threshold voltage (N-SVT) GAA devices 20N, respectively. In some embodiments, the GAA device 20N including the gate structure 200A has lower threshold voltage than the GAA device 20N including the gate structure 200B, which has lower threshold voltage than the GAA device 20N including the gate structure 200C. In some embodiments, the gate structures 200D, 200E, 200F correspond to P-type standard threshold voltage (P-SVT), low threshold voltage (P-LVT), and ultra-low threshold voltage (P-uLVT) GAA devices 20P, respectively. In some embodiments, the GAA device 20P including the gate structure 200D has higher threshold voltage (magnitude) than the GAA device 20P including the gate structure 200E, which has higher threshold voltage than the GAA device 20P including the gate structure 200F.

FIGS. 12A-12F illustrate the gate structures 200A-200F at an intermediate stage of fabrication, in which each gate structure 200A-200F includes the first IL 210 formed over the channels 22A-22C of FIG. 1A, corresponding to act 2100 of FIG. 20. In some embodiments, the channels 22A-22C corresponding to the gate structures 200A-200C are silicon, and the channels 22A-22C corresponding to the gate structures 200D-200F are silicon germanium. Only a fragmentary portion of the channel 22A is illustrated as an example in FIGS. 2A-19F for simplicity. In some embodiments, the first IL 210 includes an oxide of the semiconductor material of the substrate 110, e.g. silicon oxide. In other embodiments, the first IL 210 may include another suitable type of dielectric material. The first IL 210 has a thickness 215 (measured in the Z-direction of FIG. 12A). In some embodiments, the thickness 215 is in a range between about 5 angstroms and about 50 angstroms. In some embodiments, the thickness 215 is about 10 angstroms.

Still referring to FIGS. 12A-12F, the gate dielectric layer 220 is formed over the first IL 210, corresponding to act 2200 of FIG. 20. In some embodiments, an atomic layer deposition (ALD) process is used to form the gate dielectric layer 220 to control thickness of the deposited gate dielectric layer 220 with precision. In some embodiments, the ALD process is performed using between about 20 and 40 deposition cycles, at a temperature range between about 200 degrees Celsius and about 300 degrees Celsius. In some embodiments, the ALD process uses HfCl4 and/or H2O as precursors. Such an ALD process may form the gate dielectric layer 220 to have a thickness 225, which may be in a range between about 5 angstroms and about 100 angstroms. In some embodiments, the thickness 225 is about 15 angstroms.

In some embodiments, and as described above with respect to FIG. 1A, the gate dielectric layer 220 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 220 may include a non-high-k dielectric material such as silicon oxide. In some embodiments, the gate dielectric layer 220 includes a first high-k dielectric material layer, such as $HfO_2$ with dipole doping (La, Mg), and a second higher-k dielectric material layer, such as ZrO with crystallization.

Figures 13A, 13B, 13C, 13D, 13E, 13F:
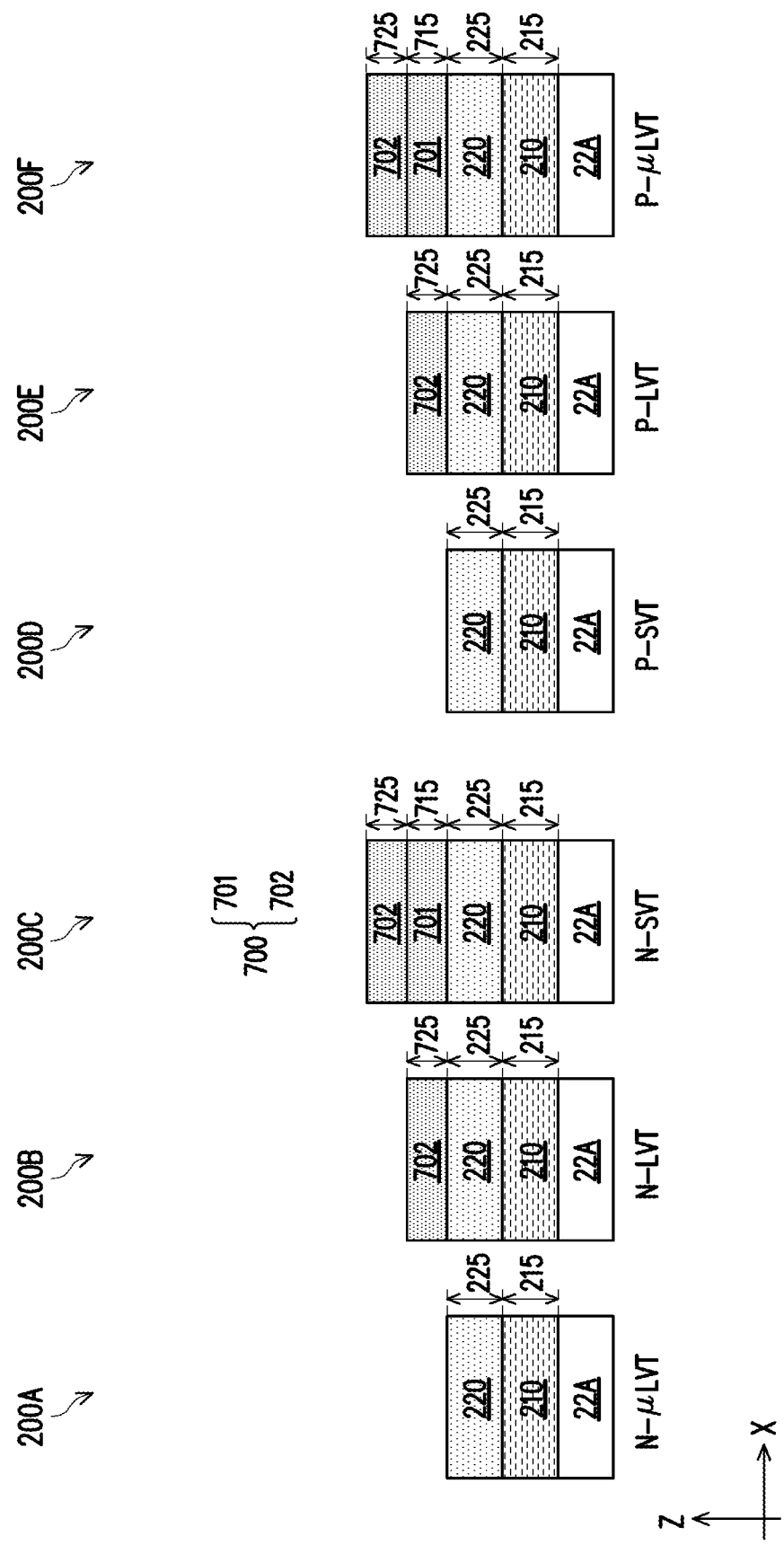
Figures 14A, 14B, 14C, 14D, 14E, 14F:
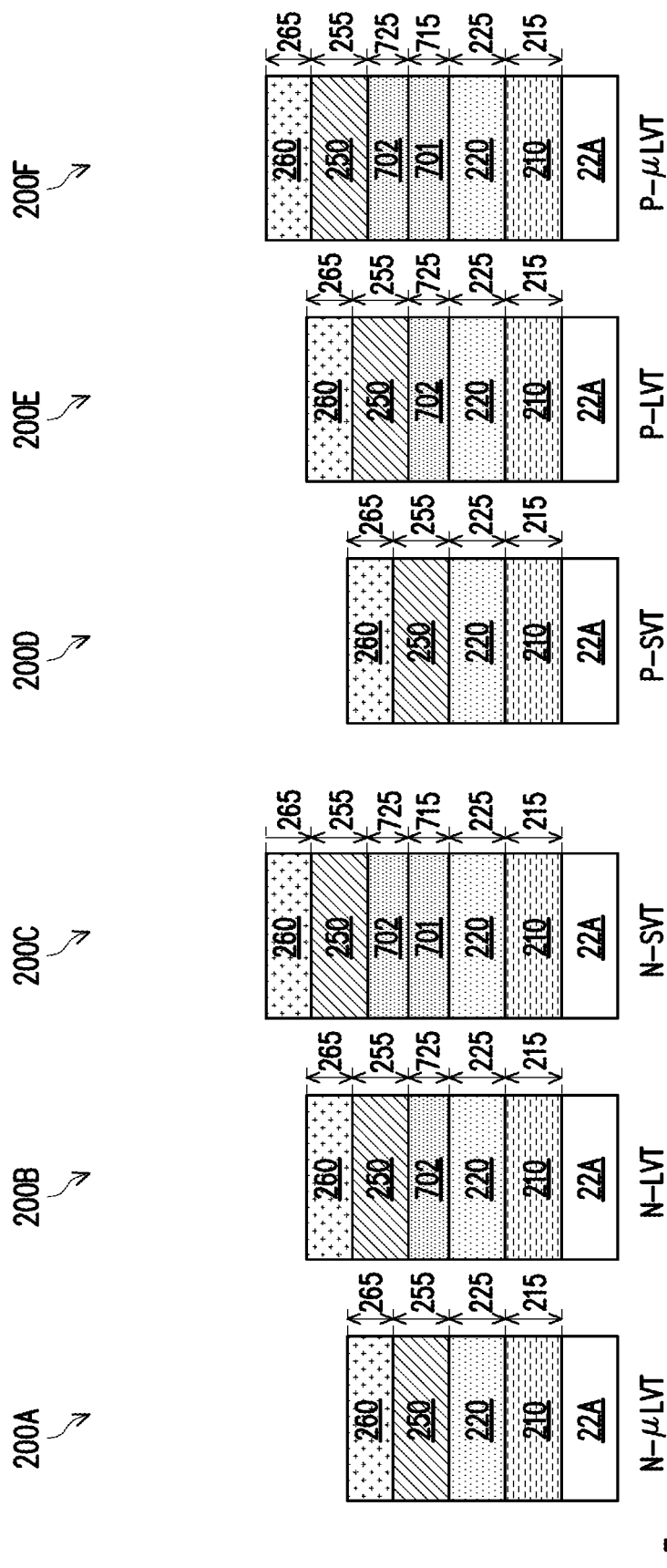
Figures 15A, 15B, 15C, 15D, 15E, 15F:
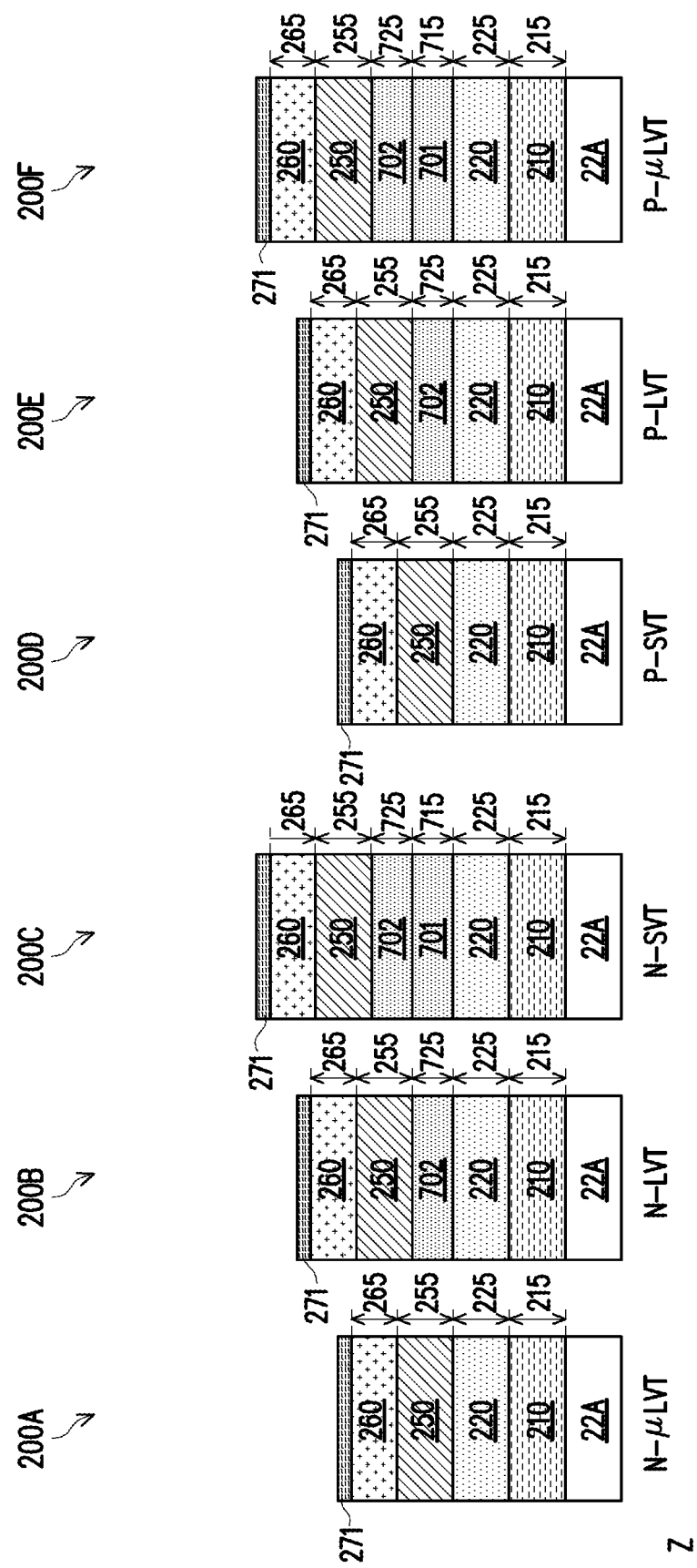
Figures 16A, 16B, 16C, 16D, 16E, 16F:
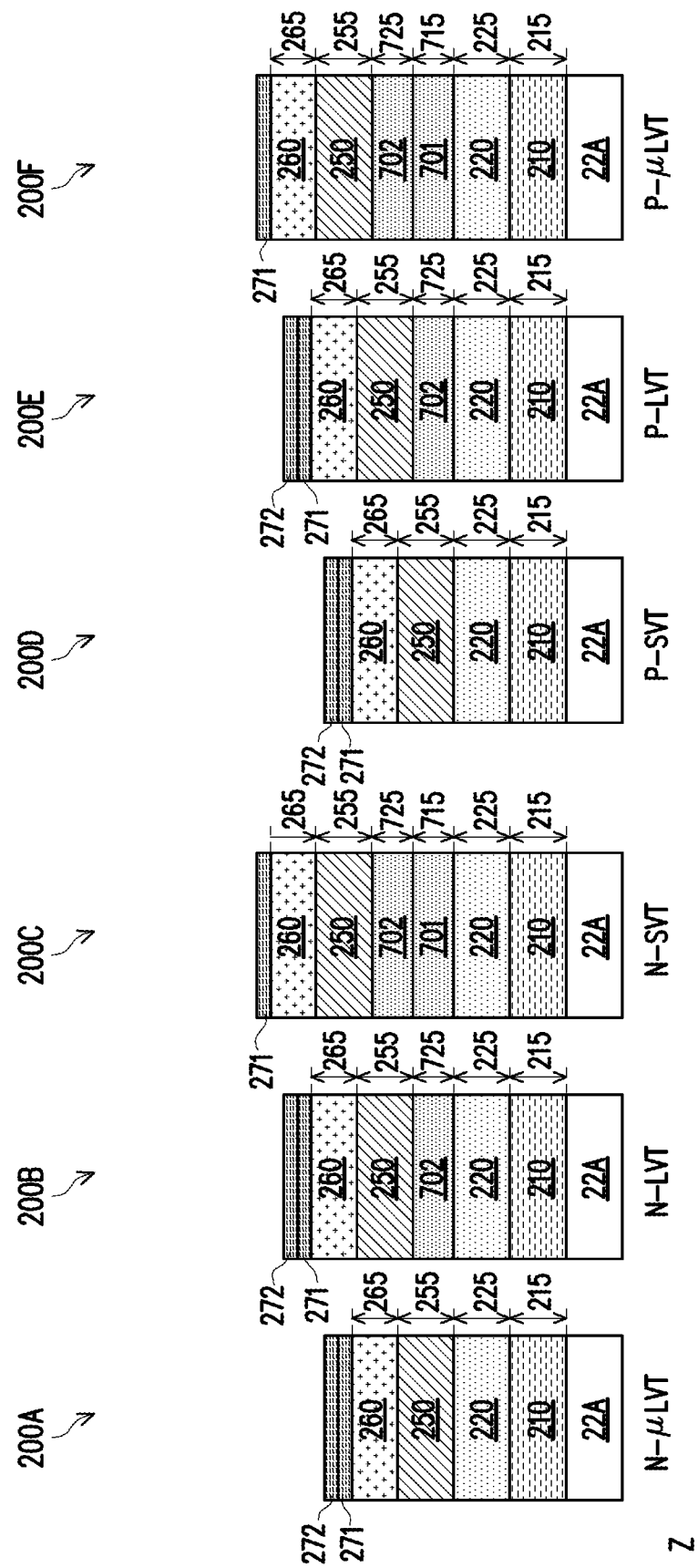
Figures 17A, 17B, 17C, 17D, 17E, 17F:
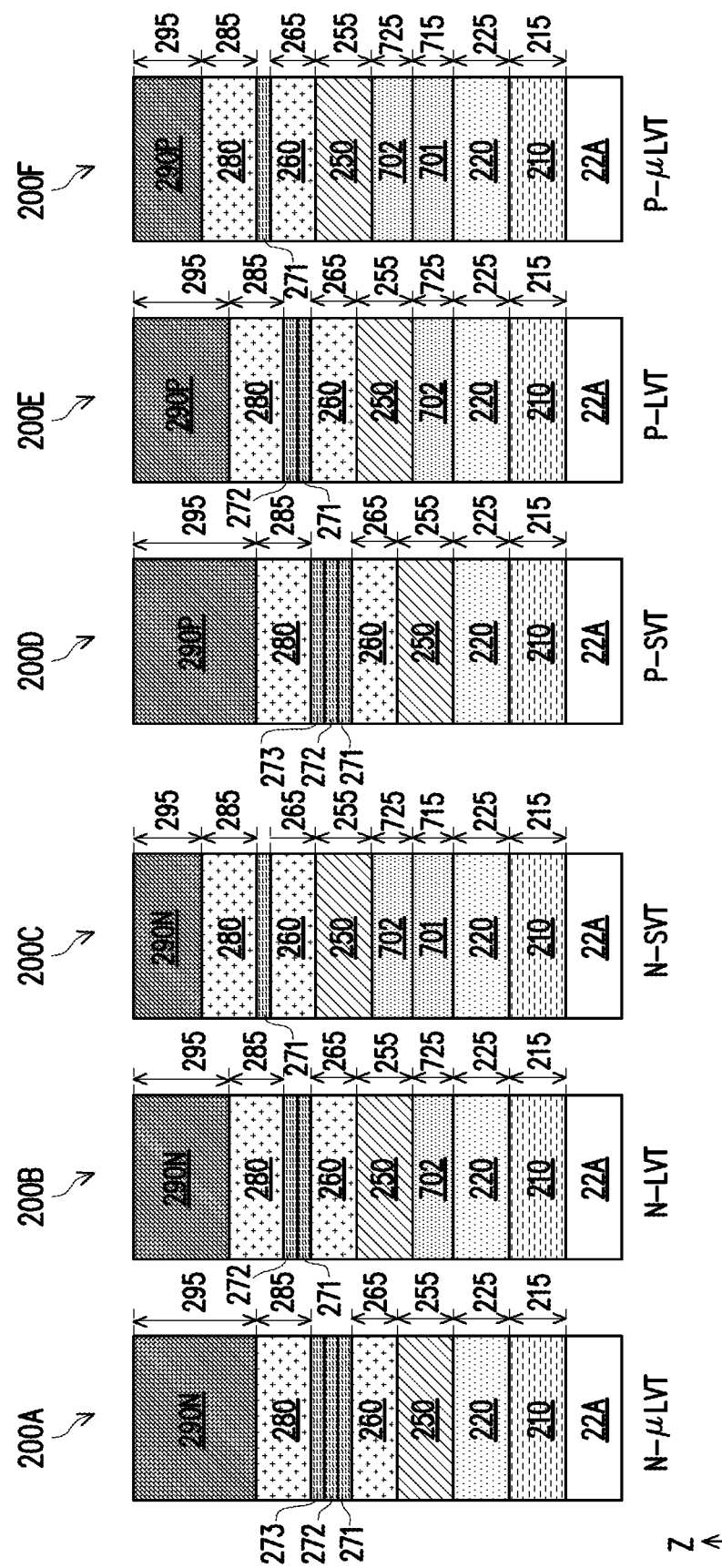
Figures 18A, 18B, 18C, 18D, 18E, 18F:
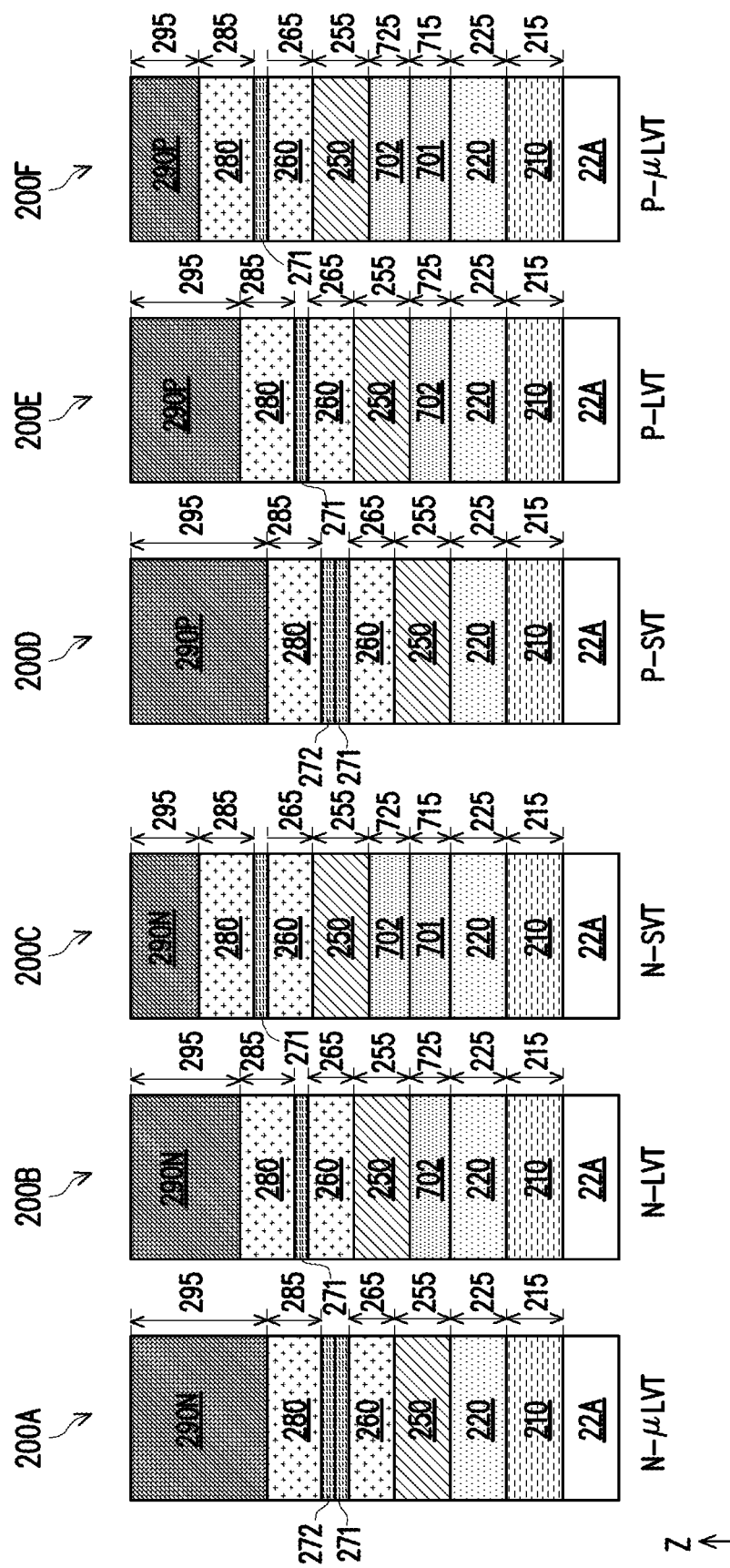
Figures 19A, 19B, 19C, 19D, 19E, 19F:
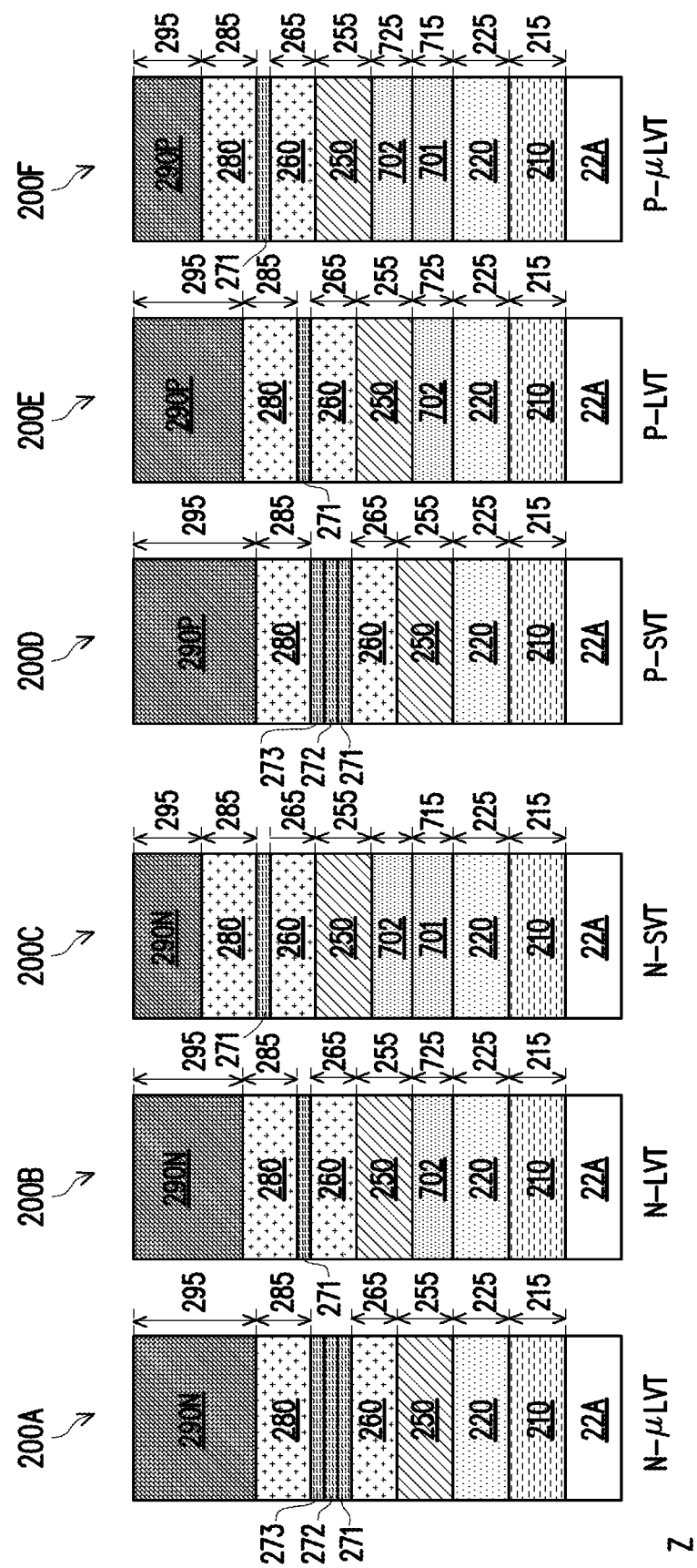

Referring now to FIGS. 13A-13F, the barrier layers 700 are formed on the gate structures 200A-200F, in accordance with some embodiments, which corresponds to act 2300 of FIG. 20. In some embodiments, the gate structures 200A, 200D are free from the barrier layers 700, as shown in FIG. 13A and FIG. 13D. In some embodiments, the barrier layers 700 include a composition of at least two of the elements including Ti, Ta, W, Mo, O, C, N, Si. In some embodiments, the barrier layers 700 are or comprise a metal compound, such as TiN, TaN, WN, MoN, WCN, TiSiN, or the like. In a specific embodiment, the barrier layers 700 are TiN. The barrier layers 700 may have thickness 715, 725 ranging from about 5 A to about 20 A. Inclusion of the barrier layers 700 provides additional threshold voltage tuning flexibility. In general, the barrier layers 700 increase the threshold voltage for NFET transistor devices, and decrease the threshold voltage (magnitude) for PFET transistor devices.

As shown in FIGS. 13A-13F, the barrier layers 700 may include at least a first barrier layer 701 and a second barrier layer 702. In some embodiments, a first deposition process is performed to form the first barrier layer 701 over the gate dielectric layer 220. Following the first deposition process, the first barrier layer 701 may be removed from the gate structures 200A, 200B, 200D, 200E by etching the first barrier layer 701 in the presence of a first mask covering the gate structures 200C, 200F. Etching of the first barrier layer 701 may be an atomic layer etch (ALE) with artificial intelligence (AI) control. The ALE is performed in cycles to remove the first barrier layer 701 while substantially not removing the gate dielectric layer 220. Each cycle may include a first pulse of $WCl_5$ (or $TaCl_5$), followed by an Ar purge, followed by a second pulse of $O_2$, followed by another Ar purge. The AI control is discussed in greater detail with respect to FIG. 21. Use of AI-controlled ALE prevents damage to the high-k material of the gate dielectric layer 220.

After formation of the first barrier layer 701, a second deposition may be performed to form the second barrier layer 702 over the first barrier layer 701 and/or the gate electrode 220. Following the second deposition process, the second barrier layer 702 may be removed from the gate structures 200A, 200D by etching the second barrier layer 702 in the presence of a second mask covering the gate structures 200B, 200C, 200E, 200F. The etching of the second barrier layer 702 may also be an AI-controlled ALE similar to that described for removing the first barrier layer 701. In some embodiments, the first barrier layer 701 has the thickness 715, and the second barrier layer 702 has the thickness 725. In some embodiments, the thickness 715 is substantially equal to the thickness 725. In some embodiments, the thickness 715 is different from the thickness 725. In some embodiments, material of the first barrier layer 701 is different from material of the second barrier layer 702. In some embodiments, the material of the first barrier layer 701 is the same as the material of the second barrier layer 702.

FIGS. 14A-14F illustrate formation of the first work function metal layer 250 and the capping layer 260 (corresponding to act 2400), which may be collectively referred to as the work function metal layers 300. In some embodiments, the first work function metal layer 250 is or comprises an N-type metal material, such as TiAlC, TiAl, TaAlC, TaAl, or the like. The first work function metal layer 250 may be formed by one or more deposition methods, such as CVD, PVD, ALD, plating, and/or other suitable methods, and has a thickness 255 of between about 10 A and 20 A. The first work function metal layer 250 may be formed directly on the gate dielectric layer 220 (gate structures 200A, 200D), or directly on the second barrier layer 702 (gate structures 200B, 200C, 200E, 200F). The capping layer 260 is formed on the first work function metal layer 250. In some embodiments, the capping layer 260 is or comprises TiN, TiSiN, TaN, WN, MoN, WCN, or another suitable material, and has a thickness 265 between about 10 A and 20 A.

FIGS. 15A-15F illustrate formation of the first protection layer 271 on the capping layer 260, corresponding to act 2500. The first protection layer 271 is an oxygen blocking layer formed on the capping layer 260 to prevent oxygen diffusion into the first work function metal layer 250, which would cause an undesirable shift in the threshold voltage. The first protection layer 271 is formed of a dielectric material that can stop oxygen from penetrating to the first work function metal layer 250, and may protect the first work function metal layer 250 from further oxidation. The first protection layer 271 may include an oxide of silicon, germanium, SiGe, Al, Ti, Hf, or another suitable material. In some embodiments, the first protection layer 271 is formed using ALD and has a thickness (in the Z-direction) between about 10 A and about 20 A. In some embodiments, the first protection layer 271 is formed as an in-situ silane passivation on the capping layer 260.

FIGS. 16A-16F illustrate formation of the second protection layer 272 on the first protection layer 271, corresponding to act 2600. The second protection layer 272 is a further oxygen blocking layer formed on the first protection layer 271 to prevent oxygen diffusion into the first work function metal layer 250, which would cause an undesirable shift in the threshold voltage. The second protection layer 272 is formed of a dielectric material that can stop oxygen from penetrating to the first work function metal layer 250, and may protect the first work function metal layer 250 from further oxidation. The second protection layer 272 may include a metal or a conductive metal oxide, such as Al, Ti, Hf, $RuO_2$, $IrO_2$, or another suitable material. In some embodiments, the second protection layer 272 is formed using ALD and has a thickness (in the Z-direction) between about 10 A and about 20 A. In some embodiments, the second protection layer 272 is removed from the gate structures 200C, 200F having both the first and second barrier layers 701, 702. In the gate structures 200C, 200F, the first work function metal layer 250 is separated from the channel 22A by the first and second barrier layers 701, 702, which reduces the effect of oxidation of the first work function metal layer 250 on the threshold voltage shift. As such, the gate structures 200C, 200F may be formed free of the second protection layer 272 to increase gate fill window.

FIGS. 17A-17F illustrate optional formation of the third protection layer 273 on the second protection layer 272, corresponding to act 2700. FIGS. 17A-17F further illustrate formation of the glue layer 270 and the metal fill layers 290N, 290P, corresponding to act 2800 and act 2900. The third protection layer 273 is a further oxygen blocking layer formed on the second protection layer 272 to prevent oxygen diffusion into the first work function metal layer 250, which would cause an undesirable shift in the threshold voltage. The third protection layer 273 is formed of a dielectric material that can stop oxygen from penetrating to the first work function metal layer 250, and may protect the first work function metal layer 250 from further oxidation. The third protection layer 273 may include a metal or a conductive metal oxide, such as Al, Ti, Hf, $RuO_2$, $IrO_2$, or another suitable material. In some embodiments, the third protection layer 273 is formed using ALD and has a thickness (in the Z-direction) between about 10 A and about 20 A. In some embodiments, the third protection layer 272 is removed from the gate structures 200C, 200F having both the first and second barrier layers 701, 702, and is further removed from the gate structures 200B, 200E having the second barrier layer 702. In the gate structures 200C, 200F, the first work function metal layer 250 is separated from the channel 22A by the first and second barrier layers 701, 702, which reduces the effect of oxidation of the first work function metal layer 250 on the threshold voltage shift. As such, the gate structures 200C, 200F may be formed free of the third protection layer 273 to increase gate fill window. Similarly, while the first work function metal layer 250 is closer to the channel 22A in the gate structures 200D, 200E than in the gate structures 200C, 200F, in some embodiments, presence of the two protection layers 271, 272 may be sufficient to mitigate oxidation of the first work function metal layer 250. As such, the gate structures 200D, 200E may also be formed free of the third protection layer 273 to increase gate fill window.

The metal fill layers 290N, 290P are formed on the glue layer 280, and may include a conductive material such as tungsten, cobalt, ruthenium, iridium, molybdenum, copper, aluminum, or combinations thereof. In some embodiments, the metal fill layers 290N, 290P may be deposited using methods such as CVD, PVD, plating, and/or other suitable processes. As shown in FIGS. 17A-17F, the metal fill layers 290N, 290P may have thickness 295. The thickness 295 may vary across the gate structures 200A-200F, due to presence or absence of either the barrier layers 700 or the protection layers 270. In embodiments in which each protection layer 271, 272, 273 is thinner than each barrier layer 701, 702, the gate structures 200C, 200F may have the smallest fill window, corresponding to the lowest thickness 295 of the metal fill layers 290N, 290P, whereas the gate structures 200A, 200D may have the largest fill window, corresponding to the greatest thickness 295.

FIGS. 18A-18F illustrate the gate structures 200A-200F in a configuration including only the first and second protection layers 271, 272. As shown, the gate structures 200A, 200D may include the first and second protection layers 271, 272, and the gate structures 200B, 200C, 200E, 200F may include the first protection layer 271 while being substantially free of the second protection layer 272. The configuration of FIGS. 18A-18F improves gate fill window by including the additional second protection layer 272 only in the gate structures 200A, 200D corresponding to the N-uLVT GAA devices 20N and the P-SVT GAA devices 20P.

FIGS. 19A-19F illustrate the gate structures 200A-200F in a configuration including the first, second and third protection layers 271, 272, 273 in the gate structures 200A, 200D, but not including the second or third protection layers 272, 273 in the gate structures 200B, 200C, 200E, 200F. As such, the N-uLVT GAA devices 20N and the P-SVT GAA devices 20P benefit from an enhanced oxidation prevention effect due to the three protection layers 271, 272, 273, while the other GAA devices 20N, 20P employing the gate structures 200B, 200C, 200E, 200F enjoy improved gate fill window due to absence of the second and third protection layers 272, 273.

FIG. 21 is an illustration of a semiconductor process system 3200, according to one embodiment. The semiconductor process system 3200 can be utilized to perform the controlled ALE processes used to form the GAA devices 20N, 20C, 20D as described in relation to FIGS. 1A-20. The semiconductor process system 3200 includes a process chamber 3202 including an interior volume 3203. A support 3206 is positioned within the interior volume 3203 and is configured to support a substrate 3204 during a thin-film etching process. The semiconductor process system 3200 is configured to etch a thin film on the substrate 3204, such as the high-k capping layer used to form the second IL 240 or the work function barrier layer 700. The semiconductor process system 3200 includes a control system 3224 that dynamically adjusts thin-film etching parameters. Details of the control system 3224 are provided after description of the operation of the semiconductor process system 3200.

In one embodiment, the semiconductor process system 3200 includes a first fluid source 3208 and a second fluid source 3210. The first fluid source 3208 supplies a first fluid into the interior volume 3203. The second fluid source 3210 supplies a second fluid into the interior volume 3203. The first and second fluids both contribute in etching a thin film on the substrate 3204. While FIG. 21 illustrates fluid sources 3208 and 3210, in practice, the fluid sources 3208 and 3210 may include or supply materials other than fluids. For example, the fluid sources 3208 and 3210 may include material sources that provide all materials for the etching process.

Figure 22:
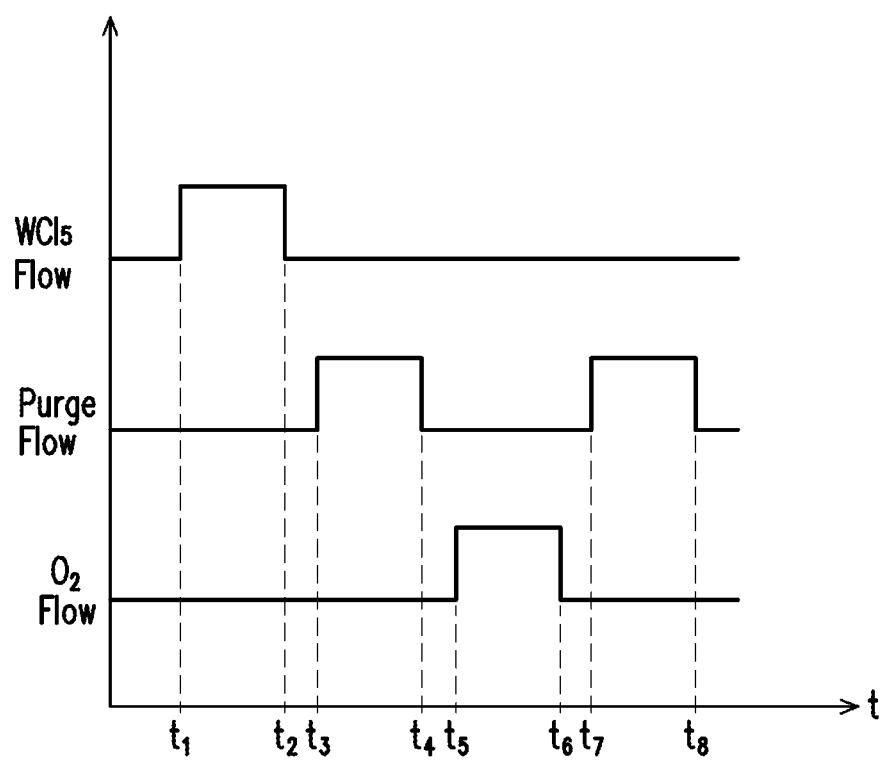

In one embodiment, the semiconductor process system 3200 is an atomic layer etching (ALE) system that performs ALE processes. The ALE system performs etching processes in cycles. Each cycle includes flowing a first etching fluid from the fluid source 3208, followed by purging the first etching fluid from the etching chamber by flowing the purge gas from one or both of the purge sources 3212 and 3224, followed by flowing a second etching fluid from the fluid source 3210, followed by purging the second etching fluid from the etching chamber by flowing the purge gas from one or both of the purge sources 3212 and 3224. This corresponds to a single ALE cycle. Each cycle etches an atomic or molecular layer from the thin-film that is being etched. A specific example of the ALE cycle is illustrated in FIG. 22.

The parameters of a thin film generated by the semiconductor process system 3200 can be affected by a large number of process conditions. The process conditions can include, but are not limited to, an amount of fluid or material remaining in the fluid sources 3208, 3210, a flow rate of fluid or material from the fluid sources 3208, 3210, the pressure of fluids provided by the fluid sources 3208 and 3210, the length of tubes or conduits that carry fluid or material into the process chamber 3202, the age of an ampoule defining or included in the process chamber 3202, the temperature within the process chamber 3202, the humidity within the process chamber 3202, the pressure within the process chamber 3202, light absorption and reflection within the process chamber 3202, surface features of the semiconductor wafer 3204, the composition of materials provided by the fluid sources 3208 and 3210, the phase of materials provided by the fluid sources 3208 and 3210, the duration of the etching process, the duration of individual phases of the etching process, and various other factors.

The combination of the various process conditions during the etching process determines the remaining thickness of a thin film etched by the ALE process. It is possible that process conditions may result in thin films that do not have remaining thicknesses that fall within target parameters. If this happens, then integrated circuits formed from the semiconductor wafer 3204 may not function properly. The quality of batches of semiconductor wafers may suffer. In some cases, some semiconductor wafers may need to be scrapped.

The semiconductor process system 3200 utilizes the control system 3224 to dynamically adjust process conditions to ensure that etching processes result in thin films having parameters or characteristics that fall within target parameters or characteristics. The control system 3224 is connected to processing equipment associated with the semiconductor process system 3200. The processing equipment can include components shown in FIG. 2A. The control system 3224 can control the flow rate of material from the fluid sources 3208 and 3210, the temperature of materials supplied by the fluid sources 3208 and 3210, the pressure of fluids provided by the fluid sources 3208 and 3210, the flow rate of material from purge sources 3212 and 3214, the duration of flow of materials from the fluid sources 3208 and 3210 and the purge sources 3212 of 3214, the temperature within the process chamber 3202, the pressure within the process chamber 3202, the humidity within the process chamber 3202, and other aspects of the thin-film etching process. The control system 3224 controls these process parameters so that the thin-film etching process results in a thin-film having target parameters such as a target remaining thickness, a target composition, a target crystal orientation, etc. Further details regarding the control system are provided in relation to FIGS. 23-24.

In one embodiment, the control system 224 is communicatively coupled to the first and second fluid sources 3208, 3210 via one or more communication channels 3225. The control system 3224 can send signals to the first fluid source 3208 and the second fluid source 3210 via the communication channels 3225. The control system 3224 can control functionality of the first and second fluid sources 3208, 3210 responsive, in part, to the sensor signals from a byproduct sensor 3222.

In one embodiment, the semiconductor process system 3200 can include one or more valves, pumps, or other flow control mechanisms for controlling the flow rate of the first fluid from the first fluid source 3208. These flow control mechanisms may be part of the fluid source 3208 or may be separate from the fluid source 3208. The control system 3224 can be communicatively coupled to these flow control mechanisms or to systems that control these flow control mechanisms. The control system 3224 can control the flow-rate of the first fluid by controlling these mechanisms. The control system 3200 may include valves, pumps, or other flow control mechanisms that control the flow of the second fluid from the second fluid source 3210 in the same manner as described above in reference to the first fluid and the first fluid source 3208.

In one embodiment, the semiconductor process system 3200 includes a manifold mixer 3216 and a fluid distributor 3218. The manifold mixer 3216 receives the first and second fluids, either together or separately, from the first fluid source 3208 and the second fluid source 3210. The manifold mixer 3216 provides either the first fluid, the second fluid, or a mixture of the first and second fluids to the fluid distributor 3218. The fluid distributor 3218 receives one or more fluids from the manifold mixer 3216 and distributes the one or more fluids into the interior volume 3203 of the process chamber 3202.

In one embodiment, the first fluid source 3208 is coupled to the manifold mixer 3216 by a first fluid channel 3230. The first fluid channel 3230 carries the first fluid from the fluid source 3208 to the manifold mixer 3216. The first fluid channel 3230 can be a tube, pipe, or other suitable channel for passing the first fluid from the first fluid source 3208 to the manifold mixer 3216. The second fluid source 3210 is coupled to the manifold mixer 3216 by second fluid channel 3232. The second fluid channel 3232 carries the second fluid from the second fluid source 3210 to the manifold mixer 3216.

In one embodiment, the manifold mixer 3216 is coupled to the fluid distributor 3218 by a third fluid line 3234. The third fluid line 3234 carries fluid from the manifold mixer 3216 to the fluid distributor 3218. The third fluid line 3234 may carry the first fluid, the second fluid, a mixture of the first and second fluids, or other fluids, as will be described in more detail below.

The first and second fluid sources 3208, 3210 can include fluid tanks. The fluid tanks can store the first and second fluids. The fluid tanks can selectively output the first and second fluids.

In one embodiment, the semiconductor process system 3200 includes a first purge source 3212 and the second purge source 3214. The first purge source is coupled to the first fluid line 3230 by first purge line 3236. The second purge source is coupled to the fluid line 3232 by second purge line 3238. In practice, the first and second purge sources may be a single purge source.

In one embodiment, the first and second purge sources 3212, 3214 supply a purging gas into the interior volume 3203 of the process chamber 3202. The purge fluid is a fluid selected to purge or carry the first fluid, the second fluid, byproducts of the first or second fluid, or other fluids from the interior volume 3203 of the process chamber 3202. The purge fluid is selected to not react with the substrate 3204, the gate metal layer on the substrate 3204, the first and second fluids, and byproducts of this first or second fluid. Accordingly, the purge fluid may be an inert gas including, but not limited to, Ar or N2.

While FIG. 21 illustrates a first fluid source 3208 and a second fluid source 3210, in practice the semiconductor process system 3200 can include other numbers of fluid sources. For example, the semiconductor process system 3200 may include only a single fluid source or more than two fluid sources. Accordingly, the semiconductor process system 3200 can include a different number than two fluid sources without departing from the scope of the present disclosure.

FIG. 22 is a graph illustrating a cycle of an ALE process performed by the semiconductor process system 3200, according to one embodiment. At time T1 the first etching fluid begins to flow. In the example of FIG. 22, the first etching fluid is WCl5. The first etching fluid flows from the fluid source 3208 into the interior volume 3203. In the interior volume 3203, the first etching fluid reacts with the top exposed layer of the high-k capping layer (e.g., TiSiN) or the work function barrier layer 700 (e.g., TiN). At time T2, the first etching fluid WCl5 stops flowing. In one example, the time elapsed between T1 and T2 is between 1 s and 10 s.

At time T3, the purge gas begins to flow. The purge gas flows from one or both of the purge sources 3212 and 3224. In one example, the purge gas is one of argon, N2, or another inert gas that can purge the first etching fluid WCl5 without reacting with the high-k capping layer (e.g., TiSiN) or the work function barrier layer 700 (e.g., TiN). At time T4, the purge gas stops flowing. In one example, the time elapsed between T3 and T4 is between 2 s and 15 s.

At time T5, the second etching fluid flows into the interior volume 3203. The second etching fluid flows from the fluid source 3210 into the interior volume 3203. In one example, the second etching fluid is O2. The O2 reacts with the top atomic or molecular layer of the titanium nitride layer 124 and completes the etching of the top atomic or molecular layer of the titanium nitride layer 124. At time T6, the second etching fluid stops flowing. In one example, the elapsed time between T5 and T6 is between 1 s and 10 s.

At time T7, the purge gas flows again and purges the interior volume 3203 of the second etching fluid. At time T8 the purge gas stops flowing. The time between T1 and T8 corresponds to a single ALE cycle.

In practice, an ALE process may include between 5 and 50 cycles, depending on the initial thickness of the high-k capping layer (e.g., TiSiN) or the work function barrier layer 700 (e.g., TiN) and the desired final thickness of the high-k capping layer (e.g., TiSiN) or the work function barrier layer 700 (e.g., TiN). Each cycle removes an atomic or molecular layer of the high-k capping layer (e.g., TiSiN) or the work function barrier layer 700 (e.g., TiN). Other materials, processes, and elapsed times can be utilized without departing from the scope of the present disclosure.

Figure 23:
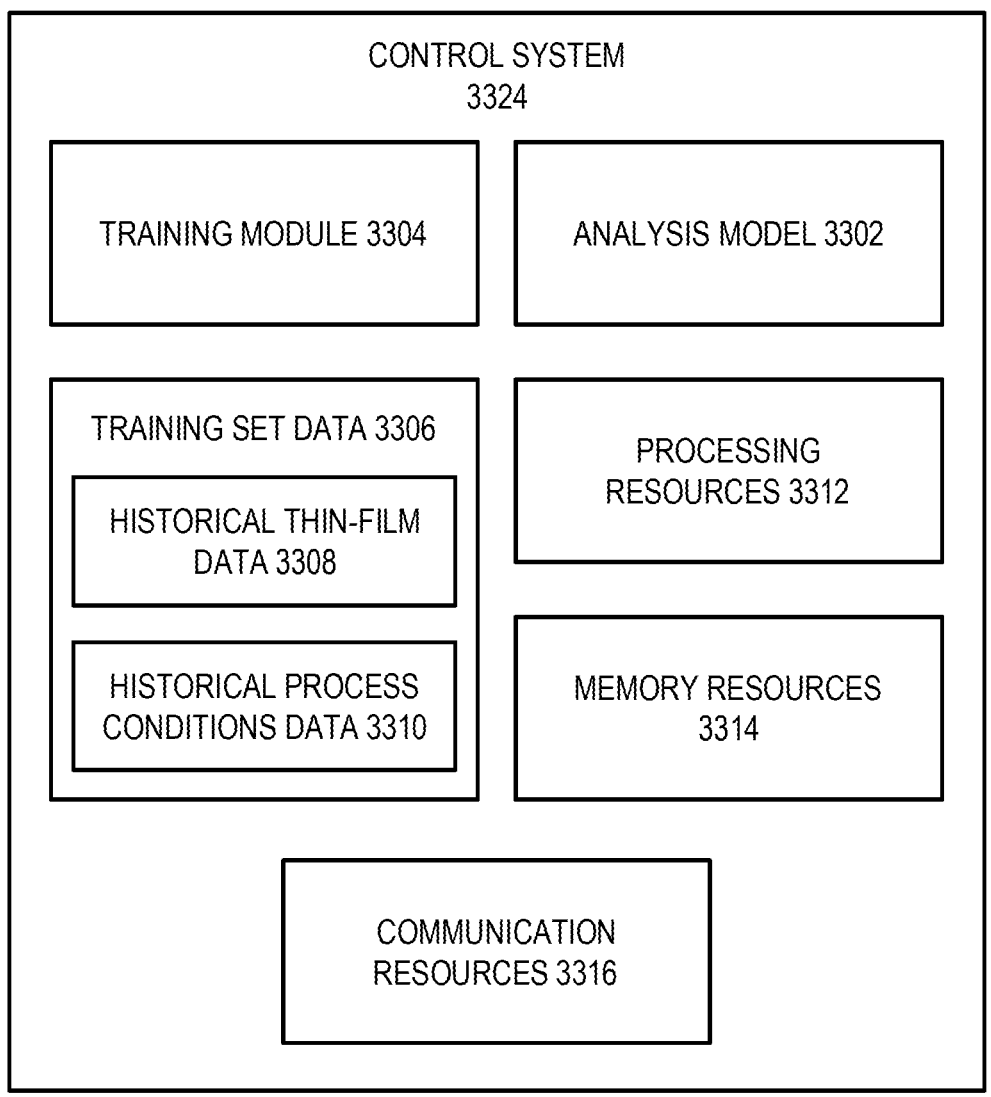

FIG. 23 is a block diagram of the control system 3224 of FIG. 21, according to one embodiment. The control system 3224 of FIG. 23 is configured to control operation of the semiconductor process system 3200 in performing ALE processes to form the GAA devices 20N, 20C, 20D of FIGS. 1A-1C, according to one embodiment. The control system 3224 utilizes machine learning to adjust parameters of the semiconductor process system 3200. The control system 3224 can adjust parameters of the semiconductor process system 3200 between ALE runs or even between ALE cycles in order to ensure that a thin-film layer formed by the ALE process falls within selected specifications.

In one embodiment, the control system 3224 includes an analysis model 3302 and a training module 3304. The training module 3304 trains the analysis model 3302 with a machine learning process. The machine learning process trains the analysis model 3302 to select parameters for an ALE process that will result in a thin film having selected characteristics. Although the training module 3304 is shown as being separate from the analysis model 3302, in practice, the training module 3304 may be part of the analysis model 3302.

The control system 3224 includes, or stores, training set data 3306. The training set data 3306 includes historical thin-film data 3308 and historical process conditions data 3310. The historical thin-film data 3308 includes data related to thin films resulting from ALE processes. The historical process conditions data 3310 includes data related to process conditions during the ALE processes that generated the thin films. As will be set forth in more detail below, the training module 3304 utilizes the historical thin-film data 3308 and the historical process conditions data 3310 to train the analysis model 3302 with a machine learning process.

In one embodiment, the historical thin-film data 3308 includes data related to the remaining thickness of previously etched thin films. For example, during operation of a semiconductor fabrication facility, thousands or millions of semiconductor wafers may be processed over the course of several months or years. Each of the semiconductor wafers may include thin films etched by ALE processes. After each ALE process, the thicknesses of the thin-films are measured as part of a quality control process. The historical thin-film data 3308 includes the remaining thicknesses of each of the thin films etched by ALE processes. Accordingly, the historical thin-film data 3308 can include thickness data for a large number of thin-films etched by ALE processes.

In one embodiment, the historical thin-film data 3308 may also include data related to the thickness of thin films at intermediate stages of the thin-film etching processes. For example, an ALE process may include a large number of etching cycles during which individual layers of the thin film are etched. The historical thin-film data 3308 can include thickness data for thin films after individual etching cycles or groups of etching cycles. Thus, the historical thin-film data 3308 not only includes data related to the total thickness of a thin film after completion of an ALE process, but may also include data related to the thickness of the thin film at various stages of the ALE process.

In one embodiment, the historical thin-film data 3308 includes data related to the composition of the remaining thin films etched by ALE processes. After a thin film is etched, measurements can be made to determine the elemental or molecular composition of the thin films. Successful etching of the thin films results in a thin film that includes particular remaining thicknesses. Unsuccessful etching processes may result in a thin film that does not include the specified proportions of elements or compounds. The historical thin-film data 3308 can include data from measurements indicating the elements or compounds that make up the various thin films.

In one embodiment, the historical process conditions 3310 include various process conditions or parameters during ALE processes that etch the thin films associated with the historical thin-film data 3308. Accordingly, for each thin film having data in the historical thin-film data 3308, the historical process conditions data 3310 can include the process conditions or parameters that were present during etching of the thin film. For example, the historical process conditions data 3310 can include data related to the pressure, temperature, and fluid flow rates within the process chamber during ALE processes.

The historical process conditions data 3310 can include data related to remaining amounts of precursor material in the fluid sources during ALE processes. The historical process conditions data 3310 can include data related to the age of the process chamber 3202, the number of etching processes that have been performed in the process chamber 3202, a number of etching processes that have been performed in the process chamber 3202 since the most recent cleaning cycle of the process chamber 3202, or other data related to the process chamber 3202. The historical process conditions data 3310 can include data related to compounds or fluids introduced into the process chamber 3202 during the etching process. The data related to the compounds can include types of compounds, phases of compounds (solid, gas, or liquid), mixtures of compounds, or other aspects related to compounds or fluids introduced into the process chamber 3202. The historical process conditions data 3310 can include data related to the humidity within the process chamber 3202 during ALE processes. The historical process conditions data 3310 can include data related to light absorption, light adsorption, and light reflection related to the process chamber 3202. The historical process conditions data 3326 can include data related to the length of pipes, tubes, or conduits that carry compounds or fluids into the process chamber 3202 during ALE processes. The historical process conditions data 3310 can include data related to the condition of carrier gases that carry compounds or fluids into the process chamber 3202 during ALE processes.

In one embodiment, historical process conditions data 3310 can include process conditions for each of a plurality of individual cycles of a single ALE process. Accordingly, the historical process conditions data 3310 can include process conditions data for a very large number of ALE cycles.

In one embodiment, the training set data 3306 links the historical thin-film data 3308 with the historical process conditions data 3310. In other words, the thin-film thickness, material composition, or crystal structure associated with a thin film in the historical thin-film data 3308 is linked (e.g., by labeling) to the process conditions data associated with that etching process. As will be set forth in more detail below, the labeled training set data can be utilized in a machine learning process to train the analysis model 3302 to predict semiconductor process conditions that will result in properly formed thin films.

In one embodiment, the control system 3324 includes processing resources 3312, memory resources 3314, and communication resources 3316. The processing resources 3312 can include one or more controllers or processors. The processing resources 3312 are configured to execute software instructions, process data, make thin-film etching control decisions, perform signal processing, read data from memory, write data to memory, and to perform other processing operations. The processing resources 3312 can include physical processing resources 3312 located at a site or facility of the semiconductor process system 3200. The processing resources can include virtual processing resources 3312 remote from the site semiconductor process system 3200 or a facility at which the semiconductor process system 3200 is located. The processing resources 3312 can include cloud-based processing resources including processors and servers accessed via one or more cloud computing platforms.

In one embodiment, the memory resources 3314 can include one or more computer readable memories. The memory resources 3314 are configured to store software instructions associated with the function of the control system and its components, including, but not limited to, the analysis model 3302. The memory resources 3314 can store data associated with the function of the control system 3224 and its components. The data can include the training set data 3306, current process conditions data, and any other data associated with the operation of the control system 3224 or any of its components. The memory resources 3314 can include physical memory resources located at the site or facility of the semiconductor process system 3200. The memory resources can include virtual memory resources located remotely from site or facility of the semiconductor process system 3200. The memory resources 3314 can include cloud-based memory resources accessed via one or more cloud computing platforms.

In one embodiment, the communication resources can include resources that enable the control system 3224 to communicate with equipment associated with the semiconductor process system 3200. For example, the communication resources 3316 can include wired and wireless communication resources that enable the control system 3224 to receive the sensor data associated with the semiconductor process system 3200 and to control equipment of the semiconductor process system 3200. The communication resources 3316 can enable the control system 3224 to control the flow of fluids or other material from the fluid sources 3308 and 3310 and from the purge sources 3312 and 3314. The communication resources 3316 can enable the control system 3224 to control heaters, voltage sources, valves, exhaust channels, wafer transfer equipment, and any other equipment associated with the semiconductor process system 3200. The communication resources 3316 can enable the control system 3224 to communicate with remote systems. The communication resources 3316 can include, or can facilitate communication via, one or more networks such as wire networks, wireless networks, the Internet, or an intranet. The communication resources 3316 can enable components of the control system 3224 to communicate with each other.

In one embodiment, the analysis model 3302 is implemented via the processing resources 3312, the memory resources 3314, and the communication resources 3316. The control system 3224 can be a dispersed control system with components and resources and locations remote from each other and from the semiconductor process system 3200.

Figure 24:
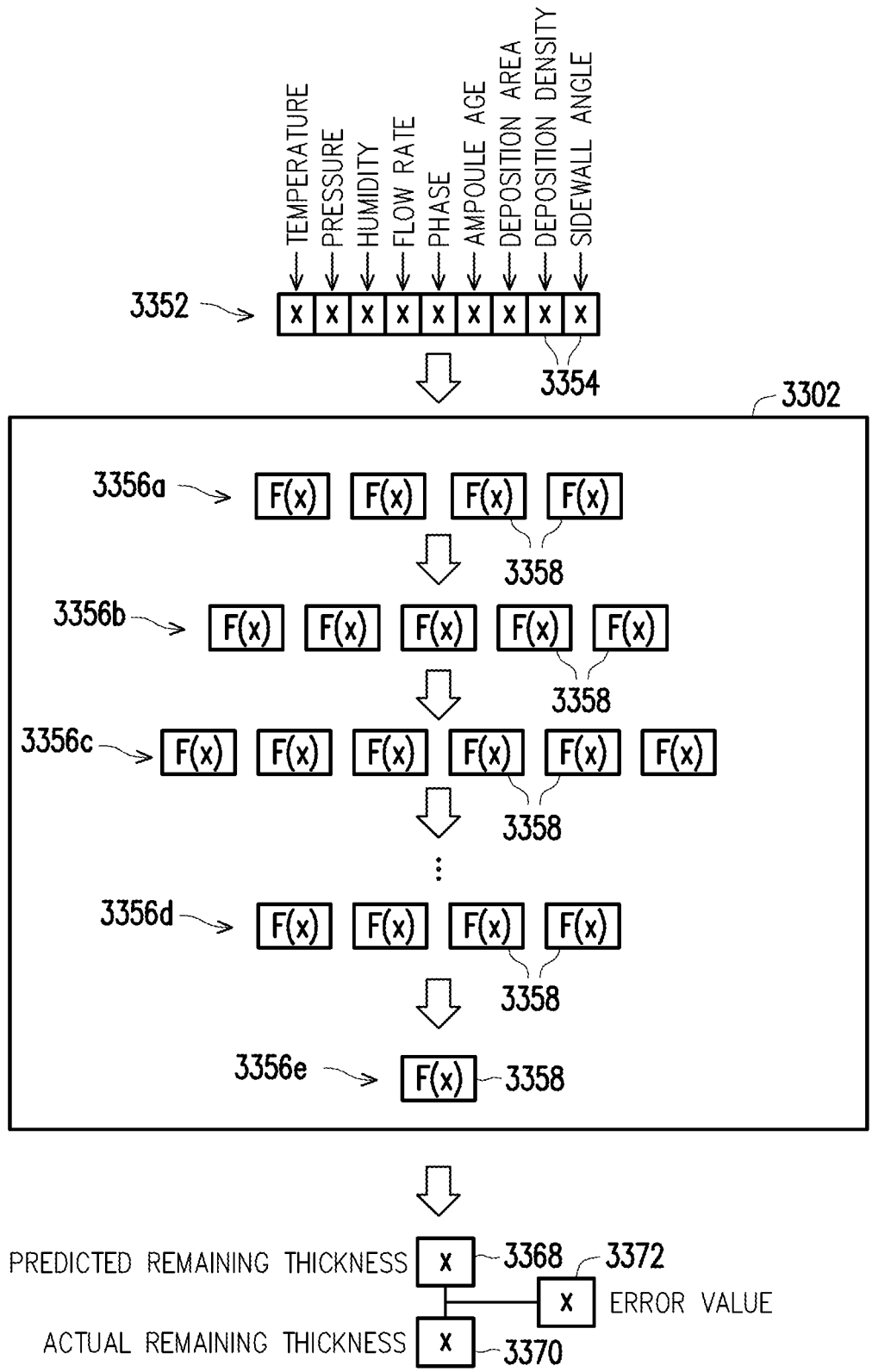

FIG. 24 is a block diagram illustrating operational aspects and training aspects of the analysis model 3302 of FIG. 23, according to one embodiment. The analysis model 3302 can be used to select parameters for ALE processes performed by the semiconductor process system 3200 of FIG. 21 to form the GAA devices 20N, 20C, 20D of FIGS. 1A-1C. As described previously, the training set data 3306 includes data related to a plurality of previously performed thin-film etching processes. Each previously performed thin-film etching process took place with particular process conditions and resulted in a thin-film having a particular characteristics. The process conditions for each previously performed thin-film etching process are formatted into a respective process conditions vector 3352. The process conditions vector includes a plurality of data fields 3354. Each data field 3354 corresponds to a particular process condition.

The example of FIG. 24 illustrates a single process conditions vector 3352 that will be passed to the analysis model 3302 during the training process. In the example of FIG. 24, the process conditions vector 3352 includes nine data fields 3354. A first data field 3354 corresponds to the temperature during the previously performed thin-film etching process. A second data field 3356 corresponds to the pressure during the previously performed thin-film etching process. A third data field 3354 corresponds to the humidity during the previously performed thin-film etching process. The fourth data field 3354 corresponds to the flow rate of etching materials during the previously performed thin-film etching process. The fifth data field 3354 corresponds to the phase (liquid, solid, or gas) of etching materials during the previously performed thin-film etching process. The sixth data field 3354 corresponds to the age of the ampoule used in the previously performed thin-film etching process. The seventh data field 3354 corresponds to a size of an etching area on a wafer during the previously performed thin-film etching process. The eighth data field 3354 corresponds to the density of surface features of the wafer utilized during the previously performed thin-film etching process. The ninth data field corresponds to the angle of sidewalls of surface features during the previously performed thin-film etching process. In practice, each process conditions vector 3352 can include more or fewer data fields than are shown in FIG. 24 without departing from the scope of the present disclosure. Each process conditions vector 3352 can include different types of process conditions without departing from the scope of the present disclosure. The particular process conditions illustrated in FIG. 24 are given only by way of example. Each process condition is represented by a numerical value in the corresponding data field 3354. For condition types that are not naturally represented in numbers, such as material phase, a number can be assigned to each possible phase.

The analysis model 3302 includes a plurality of neural layers 3356a-e. Each neural layer includes a plurality of nodes 3358. Each node 3358 can also be called a neuron. Each node 3358 from the first neural layer 3356a receives the data values for each data field from the process conditions vector 3352. Accordingly, in the example of FIG. 24, each node 3358 from the first neural layer 3356a receives nine data values because the process conditions vector 3352 has nine data fields. Each neuron 3358 includes a respective internal mathematical function labeled F(x) in FIG. 24. Each node 3358 of the first neural layer 3356a generates a scalar value by applying the internal mathematical function F(x) to the data values from the data fields 3354 of the process conditions vector 3352. Further details regarding the internal mathematical functions F(x) are provided below.

Each node 3358 of the second neural layer 3356b receives the scalar values generated by each node 3358 of the first neural layer 3356a. Accordingly, in the example of FIG. 24 each node of the second neural layer 3356b receives four scalar values because there are four nodes 3358 in the first neural layer 3356a. Each node 3358 of the second neural layer 3356b generates a scalar value by applying the respective internal mathematical function F(x) to the scalar values from the first neural layer 3356a.

Each node 3358 of the third neural layer 3356c receives the scalar values generated by each node 3358 of the second neural layer 3356b. Accordingly, in the example of FIG. 24 each node of the third neural layer 3356c receives five scalar values because there are five nodes 3358 in the second neural layer 3356b. Each node 3358 of the third neural layer 3356c generates a scalar value by applying the respective internal mathematical function F(x) to the scalar values from the nodes 3358 of the second neural layer 3356b.

Each node 3358 of the neural layer 3356d receives the scalar values generated by each node 3358 of the previous neural layer (not shown). Each node 3358 of the neural layer 3356d generates a scalar value by applying the respective internal mathematical function F(x) to the scalar values from the nodes 3358 of the second neural layer 3356b.

The final neural layer includes only a single node 3358. The final neural layer receives the scalar values generated by each node 3358 of the previous neural layer 3356d. The node 3358 of the final neural layer 3356e generates a data value 3368 by applying a mathematical function F(x) to the scalar values received from the nodes 3358 of the neural layer 3356d.

In the example of FIG. 24, the data value 3368 corresponds to the predicted remaining thickness of a thin film generated by process conditions data corresponding to values included in the process conditions vector 3352. In other embodiments, the final neural layer 3356e may generate multiple data values each corresponding to a particular thin-film characteristic such as thin-film crystal orientation, thin-film uniformity, or other characteristics of a thin film. The final neural layer 3356e will include a respective node 3358 for each output data value to be generated. In the case of a predicted thin film thickness, engineers can provide constraints that specify that the predicted thin film thickness 3368 must fall within a selected range, such as between 0 nm and 50 nm, in one example. The analysis model 3302 will adjust internal functions F(x) to ensure that the data value 3368 corresponding to the predicted thin film thickness will fall within the specified range.

During the machine learning process, the analysis model compares the predicted remaining thickness in the data value 3368 to the actual remaining thickness of the thin-film as indicated by the data value 3370. As set forth previously, the training set data 3306 includes, for each set of historical process conditions data, thin-film characteristics data indicating the characteristics of the thin-film that resulted from the historical thin-film etching process. Accordingly, the data field 3370 includes the actual remaining thickness of the thin-film that resulted from the etching process reflected in the process conditions vector 3352. The analysis model 3302 compares the predicted remaining thickness from the data value 3368 to the actual remaining thickness from the data value 3370. The analysis model 3302 generates an error value 3372 indicating the error or difference between the predicted remaining thickness from the data value 3368 and the actual remaining thickness from the data value 3370. The error value 3372 is utilized to train the analysis model 3302.

The training of the analysis model 3302 can be more fully understood by discussing the internal mathematical functions F(x). While all of the nodes 3358 are labeled with an internal mathematical function F(x), the mathematical function F(x) of each node is unique. In one example, each internal mathematical function has the following form:

$$F(x)=x1*w1+x2*w2+\ldots xn*w1+b.$$

In the equation above, each value x1-xn corresponds to a data value received from a node 3358 in the previous neural layer, or, in the case of the first neural layer 3356a, each value x1-xn corresponds to a respective data value from the data fields 3354 of the process conditions vector 3352. Accordingly, n for a given node is equal to the number of nodes in the previous neural layer. The values w1-wn are scalar weighting values associated with a corresponding node from the previous layer. The analysis model 3302 selects the values of the weighting values w1-wn. The constant b is a scalar biasing value and may also be multiplied by a weighting value. The value generated by a node 3358 is based on the weighting values w1-wn. Accordingly, each node 3358 has n weighting values w1-wn. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 3372 has been calculated, the analysis model 3302 adjusts the weighting values w1-wn for the various nodes 3358 of the various neural layers 3356a-3356e. After the analysis model 3302 adjusts the weighting values w1-wn, the analysis model 3302 again provides the process conditions vector 3352 to the input neural layer 3356a. Because the weighting values are different for the various nodes 3358 of the analysis model 3302, the predicted remaining thickness 3368 will be different than in the previous iteration. The analysis model 3302 again generates an error value 3372 by comparing the actual remaining thickness 3370 to the predicted remaining thickness 3368.

The analysis model 3302 again adjusts the weighting values w1-wn associated with the various nodes 3358. The analysis model 3302 again processes the process conditions vector 3352 and generates a predicted remaining thickness 3368 and associated error value 3372. The training process includes adjusting the weighting values w1-wn in iterations until the error value 3372 is minimized.

FIG. 24 illustrates a single process conditions vector 3352 being passed to the analysis model 3302. In practice, the training process includes passing a large number of process conditions vectors 3352 through the analysis model 3302, generating a predicted remaining thickness 3368 for each process conditions vector 3352, and generating associated error value 3372 for each predicted remaining thickness. The training process can also include generating an aggregated error value indicating the average error for all the predicted remaining thicknesses for a batch of process conditions vectors 3352. The analysis model 3302 adjusts the weighting values w1-wn after processing each batch of process conditions vectors 3352. The training process continues until the average error across all process conditions vectors 3352 is less than a selected threshold tolerance. When the average error is less than the selected threshold tolerance, the analysis model 3302 training is complete and the analysis model is trained to accurately predict the thickness of thin films based on the process conditions. The analysis model 3302 can then be used to predict thin-film thicknesses and to select process conditions that will result in a desired thin-film thickness. During use of the trained model 3302, a process conditions vector, representing current process condition for a current thin film etching process to be performed, and having the same format at the process conditions vector 3352, is provided to the trained analysis model 3302. The trained analysis model 3302 can then predict the thickness of a thin film that will result from those process conditions.

A particular example of a neural network based analysis model 3302 has been described in relation to FIG. 24. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 25:
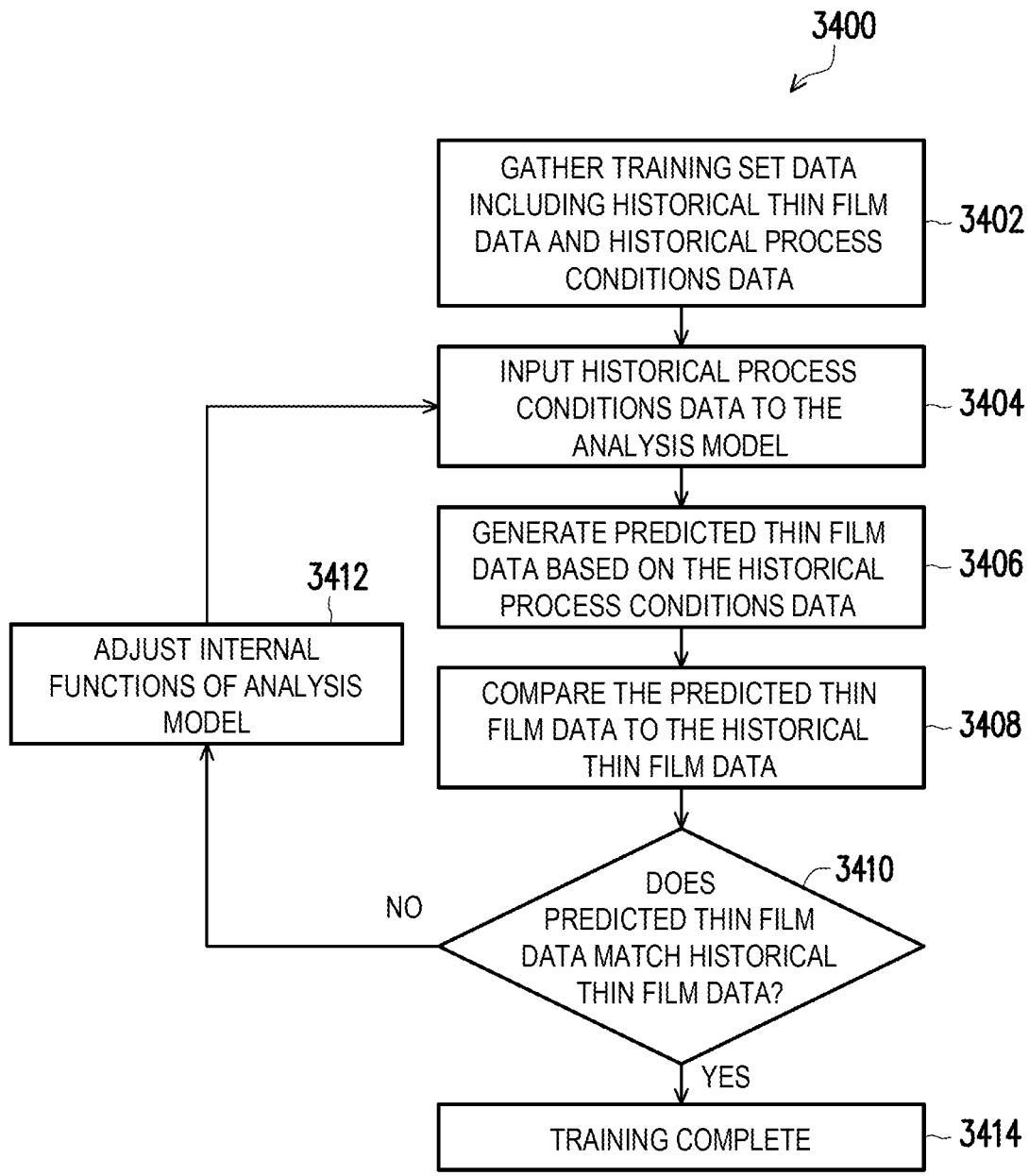

FIG. 25 is a flow diagram of a process 3400 for training an analysis model to identify process conditions that will result in proper etching of a thin film, according to one embodiment. One example of an analysis model is the analysis model 3302 of FIG. 23. The various steps of the process 3400 can utilize components, processes, and techniques described in relation to FIGS. 21-24. Accordingly, FIG. 25 is described with reference to FIGS. 21-24.

At 3402, the process 3400 gathers training set data including historical thin-film data and historical process conditions data. This can be accomplished by using a data mining system or process. The data mining system or process can gather training set data by accessing one or more databases associated with the semiconductor process system 3200 and collecting and organizing various types of data contained in the one or more databases. The data mining system or process, or another system or process, can process and format the collected data in order to generate a training set data. The training set data 3306 can include historical thin-film data 3308 and historical process conditions data 3310 as described in relation to FIG. 23.

At 3404, the process 3400 inputs historical process conditions data to the analysis model. In one example, this can include inputting historical process conditions data 3310 into the analysis model 3302 with the training module 3304 as described in relation to FIG. 23. The historical process conditions data can be provided in consecutive discrete sets to the analysis model 3302. Each district set can correspond to a single thin-film etching process or a portion of a single thin-film etching process. The historical process conditions data can be provided as vectors to the analysis model 3302. Each set can include one or more vectors formatted for reception processing by the analysis model 3302. The historical process conditions data can be provided to the analysis model 3302 in other formats without departing from the scope of the present disclosure.

At 3406, the process 3400 generates predicted thin-film data based on historical process conditions data. In particular, the analysis model 3302 generates, for each set of historical thin-film conditions data 3310, predicted thin-film data. The predicted thin-film data corresponds to a prediction of characteristics, such as the remaining thickness, of a thin film that would result from that particular set of process conditions. The predicted thin-film data can include thickness, uniformity, composition, crystal structure, or other aspects of a remaining thin film.

At 3408, the predicted thin-film data is compared to the historical thin-film data 3308. In particular, the predicted thin-film data for each set of historical process conditions data is compared to the historical thin-film data 3308 associated with that set of historical process conditions data. The comparison can result in an error function indicating how closely the predicted thin-film data matches the historical thin-film data 3308. This comparison is performed for each set of predicted thin-film data. In one embodiment, this process can include generating an aggregated error function or indication indicating how the totality of the predicted thin-film data compares to the historical thin-film data 3308. These comparisons can be performed by the training module 3304 or by the analysis model 3302. The comparisons can include other types of functions or data than those described above without departing from the scope of the present disclosure.

At 3410, the process 3400 determines whether the predicted thin-film data matches the historical thin-film data based on the comparisons generated at step 3408. For example, the process determines whether the predicted remaining thickness matches the actual remaining thickness after a historical etching process. In one example, if the aggregate error function is less than an error tolerance, then the process 3400 determines that the thin-film data matches the historical thin-film data. In one example, if the aggregate error function is greater than an error tolerance, then the process 3400 determines that the thin-film data does not match the historical thin-film data. In one example, the error tolerance can include a tolerance between 0.1 and 0. In other words, if the aggregate percentage error is less than 0.1, or 10%, then the process 3400 considers that the predicted thin-film data matches the historical thin-film data. If the aggregate percentage error is greater than 0.1 or 10%, then the process 3400 considers that the predicted thin-film data does not match the historical thin-film data. Other tolerance ranges can be utilized without departing from the scope of the present disclosure. Error scores can be calculated in a variety of ways without departing from the scope of the present disclosure. The training module 3304 or the analysis model 3302 can make the determinations associated with process step 3410.

In one embodiment, if the predicted thin-film data does not match the historical thin-film data 3308 at step 3410, then the process proceeds to step 3412. At step 3412, the process 3400 adjusts the internal functions associated with the analysis model 3302. In one example, the training module 3304 adjusts the internal functions associated with the analysis model 3302. From step 3412, the process returns to step 3404. At step 3404, the historical process conditions data is again provided to the analysis model 3302. Because the internal functions of the analysis model 3302 have been adjusted, the analysis model 3302 will generate different predicted thin-film data that in the previous cycle. The process proceeds to steps 3406, 3408 and 3410 and the aggregate error is calculated. If the predicted thin-film data does not match the historical thin-film data, then the process returns to step 3412 and the internal functions of the analysis model 3302 are adjusted again. This process proceeds in iterations until the analysis model 3302 generates predicted thin-film data that matches the historical thin-film data 3308.

In one embodiment, if the predicted thin-film data matches the historical thin-film data then process step 3410, in the process 3400, proceeds to 3414. At step 3414 training is complete. The analysis model 3302 is now ready to be utilized to identify process conditions and can be utilized in thin-film etching processes performed by the semiconductor process system 3200. The process 3400 can include other steps or arrangements of steps than shown and described herein without departing from the scope of the present disclosure.

Figure 26:
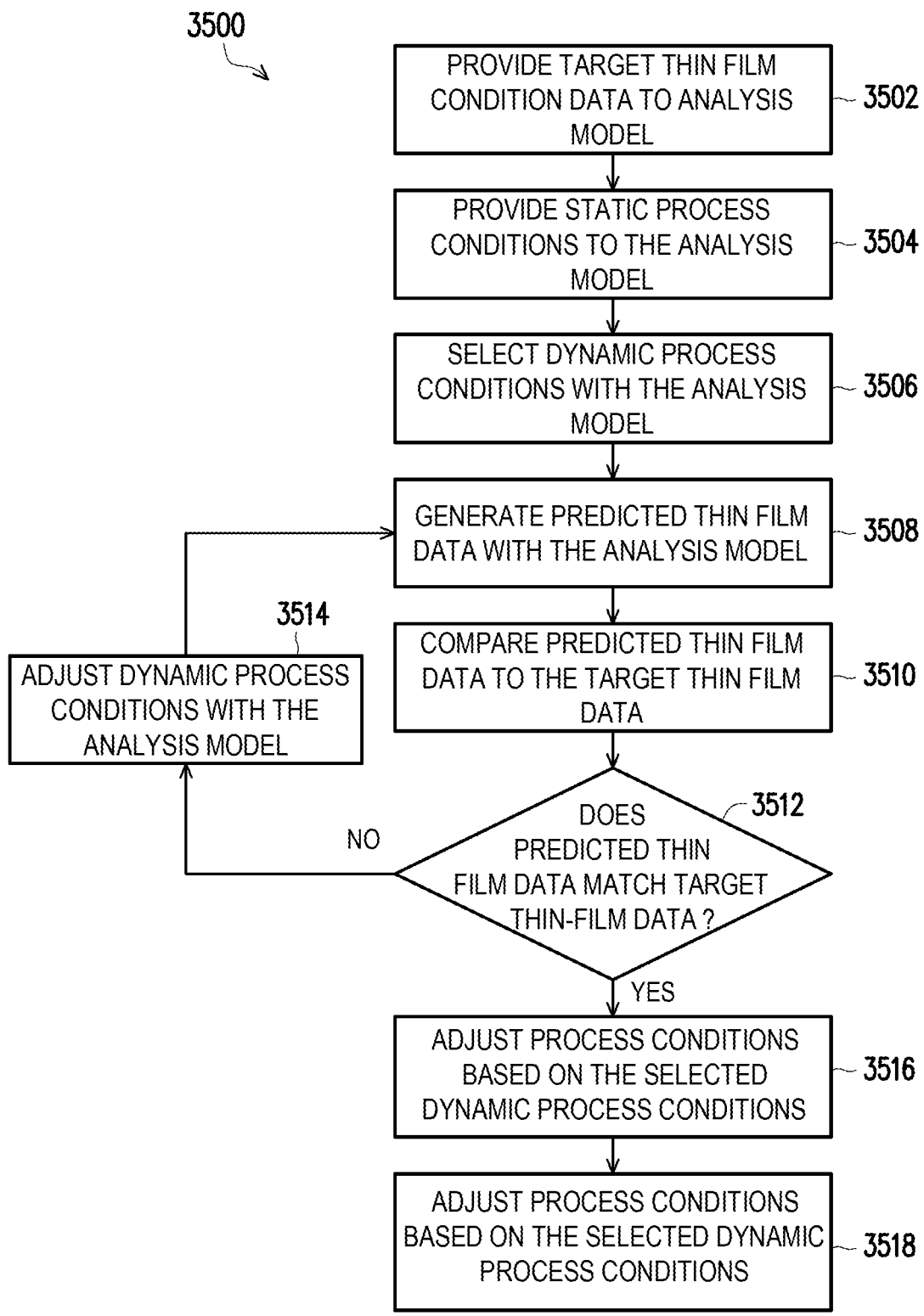

FIG. 26 is a flow diagram of a process 3500 for dynamically selecting process conditions for thin-film etching process and for performing a thin-film etching process, according to one embodiment. The various steps of the process 3500 can utilize components, processes, and techniques described in relation to FIGS. 20-24. Accordingly, FIG. 26 is described with reference to FIGS. 21-25.

At 3502, the process 3500 provides target thin-film conditions data to the analysis model 3302. The target thin-film conditions data identifies selected characteristics of a thin film to be formed by thin-film etching process. The target thin-film conditions data can include a target remaining thickness, a target composition, target crystal structure, or other characteristics of the thin film. The target thin-film conditions data can include a range of thicknesses. The target condition or characteristics that can be selected are based on thin film characteristic(s) utilized in the training process. In the example of FIG. 26, the training process focused on thin film thickness.

At 3504, the process 3500 provides static process conditions to the analysis model 3302. The static process conditions include process conditions that will not be adjusted for a next thin-film etching process. The static process conditions can include the target device pattern density indicating the density of patterns on the wafer on which the thin-film etching process will be performed. The static process conditions can include an effective plan area crystal orientation, an effective plan area roughness index, an effective sidewall area of the features on the surface of the semiconductor wafer, an exposed effective sidewall tilt angle, an exposed surface film function group, an exposed sidewall film function group, a rotation or tilt of the semiconductor wafer, process gas parameters (materials, phase of materials, and temperature of materials), a remaining amount of material fluid in the fluid sources 3208 and 3210, a remaining amount of fluid in the purge sources 3212 and 3214, a humidity within a process chamber, an age of an ampoule utilized in the etching process, light absorption or reflection within the process chamber, the length of pipes or conduits that will provide fluids to the process chamber, or other conditions. The static process conditions can include conditions other than those described above without departing from the scope of the present disclosure. Furthermore, in some cases, some of the static process conditions listed above may be dynamic process conditions subject to adjustment as will be described in more detail below. In the example of FIG. 26, dynamic process conditions include temperature, pressure, humidity, and flow rate. Static process conditions include phase, ampoule age, etching area, etching density, and sidewall angle.

At 3506, the process 3500 selects dynamic process conditions for the analysis model, according to one embodiment. The dynamic process conditions can include any process conditions not designated as static process conditions. For example, the training set data may include a large number of various types of process conditions data in the historical process conditions data 3310. Some of these types of process conditions will be defined as the static process conditions and some of these types of process conditions will be defined as dynamic process conditions. Accordingly, when the static process conditions are supplied at operation 3504, the remaining types of process conditions can be defined as dynamic process conditions. The analysis model 3302 can initially select initial values for the dynamic process conditions. After the initial values have been selected for the dynamic process conditions, the analysis model has a full set of process conditions to analyze. In one embodiment, the initial values for the dynamic process conditions may be selected based on previously determined starter values, or in accordance with other schemes.

The dynamic process conditions can include the flow rate of fluids or materials from the fluid sources 3208 and 3210 during the etching process. The dynamic process conditions can include the flow rate of fluids or materials from the purge sources 3212 and 3214. The dynamic process conditions can include a pressure within the process chamber, a temperature within the process chamber, a humidity within the process chamber, durations of various steps of the etching process, or voltages or electric field generated within the process chamber. The dynamic process conditions can include other types of conditions without departing from the scope of the present disclosure.

At 3508, the analysis model 3302 generates predicted thin-film data based on the static and dynamic process conditions. The predicted thin-film data includes the same types of thin-film characteristics established in the target thin-film conditions data. In particular, the predicted thin-film data includes the types of predicted thin-film data from the training process described in relation to FIGS. 21-25. For example, the predicted thin-film data can include thin-film thickness, film composition, or other parameters of thin films.

At 3510, the process compares the predicted thin-film data to the target thin-film data. In particular, the analysis model 3302 compares the predicted thin-film data to the target thin-film data. The comparison indicates how closely the predicted thin-film data matches the target thin-film data. The comparison can indicate whether or not predicted thin-film data falls within tolerances or ranges established by the target thin-film data. For example, if the target thin-film thickness is between 1 nm and 9 nm, then the comparison will indicate whether the predicted thin-film data falls within this range.

At 3512, if the predicted thin-film data does not match the target thin-film data, then the process proceeds to 3514. At 3514, the analysis model 3302 adjusts the dynamic process conditions data. From 3514 the process returns to 3508. At 3508, the analysis model 3302 again generates predicted thin-film data based on the static process conditions and the adjusted dynamic process conditions. The analysis model then compares the predicted thin-film data to the target thin-film data at 3510. At 3512, if the predicted thin-film data does not match the target thin-film data, then the process proceeds to 3514 and the analysis model 3302 again adjusts the dynamic process conditions. This process proceeds until predicted thin-film data is generated that matches the target thin-film data. If the predicted thin-film data matches the target thin-film data 3512, then the process proceeds to 3516.

At 3516, the process 3500 adjusts the thin-film process conditions of the semiconductor process system 3200 based on the dynamic process conditions that resulted in predicted thin-film data within the target thin-film data. For example, the control system 3224 can adjust fluid flow rates, etching step durations, pressure, temperature, humidity, or other factors in accordance with the dynamic process conditions data.

At 3518, the semiconductor process system 3200 performs a thin-film etching process in accordance with the adjusted dynamic process conditions identified by the analysis model. In one embodiment, the thin-film etching process is an ALE process. However, other thin-film etching processes can be utilized without departing from the scope of the present disclosure. In one embodiment, the semiconductor process system 3200 adjusts the process parameters based on the analysis model between individual etching stages in a thin-film etching process. For example, in an ALE process, the thin-film is etched one layer at a time. The analysis model 3302 can identify parameters to be utilized for etching of the next layer. Accordingly, the semiconductor process system can adjust etching conditions between the various etching stages.

Embodiments may provide advantages. The gate structures 200A-200F improve gate fill window, and achieve lower gate resistance and higher reliability, while providing multiple Vt tuning with photolithographic patterning. Oxidation of the first work function metal layer 250 may be reduced by depositing the first, second and/or third protection layers 271, 272, 273 over the capping layer 260. AI-controlled ALE promotes high-precision removal of the barrier layers 700 for further tuning of the threshold voltages. These techniques improve the flexibility in tuning the threshold voltage.

In accordance with at least one embodiment, a device includes a substrate, a semiconductor channel over the substrate, and a gate structure over and laterally surrounding the semiconductor channel. The gate structure includes a first dielectric layer over the semiconductor channel, a first work function metal layer over the first dielectric layer, a first protection layer over the first work function metal layer, a second protection layer over the first protection layer, and a metal fill layer over the second protection layer.

In accordance with at least one embodiment, a device includes a first gate structure and a second gate structure. The first gate structure includes a first dielectric layer over a first semiconductor channel, a first work function metal layer over the first dielectric layer, a first protection layer over the first work function metal layer, a second protection layer over the first protection layer and a first metal fill layer over the second protection layer. The second gate structure includes a second dielectric layer over a second semiconductor channel, a first barrier layer over the second dielectric layer, a second work function metal layer over the first barrier layer, a third protection layer over the second work function metal layer, and a second metal fill layer over the third protection layer.

In accordance with at least one embodiment, a method comprises forming a first dielectric layer over a first channel, forming a first work function metal layer over the first dielectric layer, forming a first protection layer over the first work function metal layer, forming a second protection layer over the first protection layer, and forming a first metal fill layer over the second protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a substrate;
    a semiconductor channel over the substrate; and
    a gate structure over and laterally surrounding the semiconductor channel, comprising:
        a first dielectric layer over the semiconductor channel;
        a first work function metal layer over and in physical contact with the first dielectric layer;
        a first protection layer over the first work function metal layer;
        a second protection layer over the first protection layer; and
        a metal fill layer over the second protection layer,
        a third protection layer over the first protection layer and the second protection layer; and
        a capping layer in physical contact with the first protection layer and the first work function metal layer.

2. The device of claim 1, wherein the gate structure further comprises a barrier layer between the first work function metal layer and the first dielectric layer.

3. The device of claim 1, wherein:
    the first protection layer comprises Si, Ge, SiGe, Al, Ti, or Hf; and
    the second protection layer comprises a metal or a conductive metal oxide.

4. The device of claim 1, wherein the gate structure further comprises:
    an interfacial layer between the first dielectric layer and the semiconductor channel.

5. The device of claim 1, wherein the gate structure is further over and surrounding a second semiconductor channel between the first semiconductor channel and the substrate.

6. The device of claim 1, wherein the first protection layer is an in-situ silane passivation layer.

7. A device, comprising:
    a first gate structure comprising:
        a first dielectric layer over a first semiconductor channel;
        a first work function metal layer over the first dielectric layer;
        a first protection layer over the first work function metal layer;
        a second protection layer over the first protection layer; and
        a first metal fill layer over the second protection layer; and
    a second gate structure comprising:
        a second dielectric layer over a second semiconductor channel;
        a first barrier layer over the second dielectric layer;
        a second work function metal layer over the first barrier layer;
        a third protection layer over the second work function metal layer; and
        a second metal fill layer over the third protection layer;
    wherein the first protection layer and the third protection layer are in-situ silane passivation layers.

8. The device of claim 7, wherein the first semiconductor channel and the second semiconductor channel are formed in the same material layer.

9. The device of claim 7, wherein the first semiconductor channel is silicon and the second semiconductor channel is SiGe.

10. The device of claim 7, wherein the first gate structure further comprises a fourth protection layer over the second protection layer.

11. The device of claim 7, wherein the second gate structure further comprises a second barrier layer between the first barrier layer and the second work function metal layer.

12. A method, comprising:
- forming a first dielectric layer over a first channel;
- forming a first barrier layer over the first dielectric layer;
- forming a first work function metal layer over the first dielectric layer;
- removing the first barrier layer;
- forming a first protection layer over the first work function metal layer;
- forming a second protection layer over the first protection layer; and
- forming a first metal fill layer over the second protection layer;
- wherein the first work function metal layer is formed over the first barrier layer.

13. The method of claim 12, further comprising:
- forming a third protection layer over the second protection layer before forming the first metal fill layer.

14. The method of claim 12, wherein removing the first barrier layer is by an artificial-intelligence (AI) controlled atomic layer etch (ALE) process.

15. The method of claim 12, further comprising:
- forming an interfacial layer over the first channel, wherein the first dielectric layer is formed over the interfacial layer;
- forming a capping layer over the first work function metal layer, wherein the first protection layer is formed over the capping layer; and
- forming a glue layer over the second protection layer, wherein the first metal fill layer is formed over the glue layer.

16. The method of claim 12, further comprising:
- forming the first dielectric layer over a second channel located over a different region of a substrate than the first channel; and
- removing the second protection layer from over the second channel while the second protection layer over the first channel is not exposed.

17. The method of claim 16, further comprising forming a second barrier layer over the first barrier layer on the second channel and over the first dielectric layer on the first channel.

18. The method of claim 17, further comprising removing the second barrier layer from over the first channel.

19. The method of claim 18, further comprising:
- forming a third protection layer on the second channel and over the second protection layer on the first channel; and
- removing the third protection layer from over the second channel.

20. The method of claim 12, wherein the first protection layer is an in-situ silane passivation layer.

* * * * *